(12) United States Patent
Takeda et al.

(10) Patent No.: US 8,618,667 B2
(45) Date of Patent: Dec. 31, 2013

(54) SEMICONDUCTOR DEVICE AND METHOD OF MANUFACTURING THE SAME

(75) Inventors: Kenichi Takeda, Higashimurayama (JP); Mayu Aoki, Kokubunji (JP); Kazuyuki Hozawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/443,869

(22) Filed: Apr. 10, 2012

(65) Prior Publication Data

US 2012/0256311 A1 Oct. 11, 2012

(30) Foreign Application Priority Data

Apr. 11, 2011 (JP) ................................. 2011-087061

(51) Int. Cl.
*H01L 23/48* (2006.01)
*H01L 23/52* (2006.01)

(52) U.S. Cl.
USPC ........... 257/774; 257/737; 257/773; 438/455; 438/629

(58) Field of Classification Search
USPC .......... 257/774, 737, 773, E23.068, E21.567; 438/455, 629
See application file for complete search history.

(56) References Cited

U.S. PATENT DOCUMENTS

| 2003/0060035 A1 | 3/2003 | Kimura et al. | |
| 2003/0080433 A1* | 5/2003 | Hanaoka et al. | 257/765 |
| 2007/0018330 A1* | 1/2007 | Takeda et al. | 257/762 |
| 2007/0207592 A1 | 9/2007 | Lu et al. | |

FOREIGN PATENT DOCUMENTS

JP 2003-100801 A 4/2003

* cited by examiner

*Primary Examiner* — Theresa T Doan
(74) *Attorney, Agent, or Firm* — Miles & Stockbridge P.C.

(57) ABSTRACT

A bump electrode, a dummy bump, and a heat-resistant polymer film, whose upper-surface heights are uniformed, are formed on each of a first silicon substrate and a second silicon substrate, and then, the first silicon substrate and the second silicon substrate are bonded to each other so that the bump electrodes formed on the respective substrates are electrically connected to each other. At this time, the dummy bump is arranged so as to be bonded to the heat-resistant polymer film on the silicon substrate opposed thereto, so that a semiconductor device having both of good electrical connection between the bump electrodes and bump protection performance obtained by a polymer film with high heat resistance and without voids can be achieved.

7 Claims, 11 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. 2011-087061 filed on Apr. 11, 2011, the content of which is hereby incorporated by reference into this application.

TECHNICAL FIELD OF THE INVENTION

The present invention relates to a semiconductor device and a method of manufacturing the same. More particularly, the present invention relates to a technique effectively applied to a semiconductor device in which a plurality of semiconductor substrates are electrically connected to each other via a bump electrode, and a method of manufacturing the same.

BACKGROUND OF THE INVENTION

In recent years, as one of methods of achieving a miniaturized and high-performance semiconductor device, a mounting technique of laminating semiconductor substrates (hereinafter, referred to as silicon substrates) each made of monocrystalline silicon and electrically connecting the silicon substrates to each other by using a fine electrode wiring has been developed.

Among the above-described mounting techniques, a method on which has been recently focused is a method of electrically connecting integrated circuits to each other, which are formed on a plurality of silicon substrates, by using a fine electrode which is called bump electrode for connecting the silicon substrates to each other and using an electrode which is called Through Silicon Via penetrating through the silicon substrates.

In a case of a semiconductor device to which the above-described method is applied, connection reliability of the bump electrode for connecting the silicon substrates to each other is degraded due to the stress such as heat or mechanical impact applied to the silicon substrates. Therefore, a technique is also required, in which the bump electrode is protected by sealing a periphery of the bump electrode with an insulator such as a polymer for ensuring the connection reliability of the bump electrode.

A solder material containing tin (Sn) or lead (Pb) as a main component is currently widely used as a bump electrode material formed on a silicon substrate. The integrated circuits which are formed on different silicon substrates from each other can be electrically connected to each other by heating the bump electrode which is formed on the silicon substrate and which is made of the solder material up to a melting point of the solder material or higher and bonding the bump electrode to an opposite bump electrode which is formed on a substrate to be connected. Also, for the protection of the bump electrode by using such a solder material, generally, an Epoxy-based polymer is used due to limitation of a process temperature, and fine particles of silicon oxide called filler are added thereto in order to adjust a coefficient of thermal expansion.

However, the melting point of the solder material is low, and therefore, there is a problem of low electrical reliability for a long period. For example, a melting point of a tin (Sn)-silver (Ag)-copper (Cu) material, which is such a lead-free solder material as currently widely used for electronic components, is about 220° C. This temperature is much lower than a melting point (660° C.) of aluminum (Al) which is widely used as an interconnection of an integrated circuit, and therefore, there is a problem that electrical connection failure tends to occur due to a current called Electromigration. More particularly, under a state that the bump electrode is miniaturized to cause high current density, the reliability is seriously decreased.

Accordingly, as the material of the bump electrode, a method of using a metal material having high Electromigration reliability has been proposed.

For example, U.S. Patent Application Laid-Open Publication No. 2007/0207592 (Patent Document 1) discloses a method of using copper (Cu) as the material of the bump electrode. A melting point of copper is as high as 1084° C., and it is known that its Electromigration reliability is higher than that of aluminum. From this view point, even if the bump electrode is miniaturized to cause the high current density in the bump electrode, the decrease in the Electromigration reliability of the device with using the bump electrode mainly containing copper can be prevented, so that the connection is possible. Hereinafter, the method described in Patent Document 1 is referred to as conventional example 1.

Japanese Patent Application Laid-Open Publication No. 2003-100801 (Patent Document 2) describes that a bump electrode and a dummy bump are formed on one silicon substrate, a metal wiring and a protection film are formed on the other silicon substrate, the bump electrode is bonded to the metal wiring and the dummy bump is bonded to the protection film when the silicon substrates are stuck to each other, and, after the bonding, a polymer for the bump protection is injected. Hereinafter, the method described in Patent Document 2 is referred to as conventional example 2.

SUMMARY OF THE INVENTION

The conventional example 1 describes a method of forming a miniaturized bump electrode which is made of copper and whose periphery is surrounded by a heat-resistant polymer by forming and patterning a film made of benzocyclobutene which is the heat-resistant polymer on a silicon substrate, and then, forming a barrier metal film and a copper film thereon, then, removing excessive copper film and barrier metal film on benzocyclobutene by using the chemical mechanical polishing (CMP) method. Further, it discloses a method of bonding the bumps to each other by heating the bumps formed in such a manner at 250° C. to 350° C. and applying a load of 10 kN (kilonewton) per silicon substrate whose diameter is 200 mm.

However, in the case of the above-described conventional example 1, when the bump is formed by using the CMP method, there is a problem that planarity of a surface of the silicon substrate is decreased due to the cutting off of a part of the bump, the local cutting off of the benzocyclobutene (polymer film) between the adjacent bumps, or others upon the CMP, and therefore, the connection reliability of the bump is decreased when the silicon substrates are stuck to each other.

This problem can be solved by providing the dummy bump on the periphery of the bump in order to improve the planarity by the polishing in using the CMP method. However, in order to keep a bonding load per bump constant, it is required to increase the load applied to the silicon substrate as much as the increase in the number of bumps to be provided. If the number of bumps per silicon substrate is numerously increased in order to maintain the planarity of the surface of the silicon substrate, the maximum load (about 100 kN) of a commercialized bonding machine is not sufficiently enough to obtain the bonding between the copper bumps, and therefore, there is a problem of the decrease in the connection reliability of the bump electrode.

A method for solving this problem is disclosed in the conventional example 2.

FIG. 18 illustrates a cross-sectional view of a principal part of a semiconductor device including the same structure with that of a semiconductor device obtained after sticking the silicon substrates in the conventional example 2, as a comparison example. A plurality of metal wirings 200 are formed on a silicon substrate 102, and then, a bump electrode 231 is formed on a part of the metal wirings 200, and a dummy bump 241 is formed on the other part of the metal wirings 200. Aside from this, a metal wiring 201 and a protection film 310 are sequentially formed on a silicon substrate 103. A part of an upper surface of the metal wiring 201 is exposed from the protection film 310. The silicon substrates 102 and 103 prepared as described above are stuck to each other so as to connect the bump electrode 231 on the silicon substrate 102 and the metal wiring 201 on the silicon substrate 103, so that the silicon substrates 102 and 103 can be electrically connected to each other. At this time, since the dummy bump 241 on the silicon substrate 102 is in contact with the protection film 310 which is an insulator formed on the silicon substrate 103, bonding energy for forming the metallic bonding, that is, the load applied by the bonding machine for sticking the silicon substrates can be reduced compared to a case of bonding the dummy bump 241 to the metal wiring 201.

FIG. 19 illustrates a cross-sectional view of a principal part of a semiconductor device obtained after forming (filling with) an underfill polymer for the bump protection between the silicon substrates which are stuck by the method described with reference to FIG. 18 in the conventional example 2. After sticking the silicon substrates 102 and 103, a precursor of the underfill polymer is flown in from end portions of the stuck silicon substrates in order to protect the bump electrode 231, and heat treatment is performed, so that an underfill polymer film 320 is buried in a space between the silicon substrates 102 and 103.

The conventional example 2 describes above that the bump electrode and the dummy bump are formed on one silicon substrate, the metal wiring and the protection film are formed on the other silicon substrate, the bump electrode is bonded to the metal wiring and the dummy bump is bonded to the protection film upon the sticking of the silicon substrates, and after the bonding, the polymer for the bump protection is injected. However, there are the following problems.

First, since the periphery of the bump has not been protected yet by the insulating film upon the sticking of the silicon substrates, it is required to inject the polymer for the bump protection from the end portions of the silicon substrates after the sticking of the silicon substrates. Therefore, if a height of the bump is lowered to narrow the space between the silicon substrates, the space cannot be completely filled with the polymer injected from the end portions of the silicon substrates, and an airspace called void occurs inside the polymer, and therefore, the connection reliability of the bump is decreased.

Second, since the polymer for the bump protection is injected from the end portions of the stuck silicon substrates, it is required to keep a polymer viscosity low during the injection of the polymer. Generally, a low-viscosity polymer tends to have a low heat resistance. For example, in the Epoxy-based polymer of a representative example for the injected polymer, its thermal decomposition starts at about 250° C. to cause its volume shrinkage. Therefore, when a next silicon substrate is stuck after injecting the Epoxy-based polymer into the stuck silicon substrates, it is required to set a sticking temperature at 250° C. or lower. That is, after the sticking of the silicon substrates and the injection of the polymer, if the sticking is performed by the copper bump which requires a relatively high temperature, the volume shrinkage and alteration of the previously-formed polymer film for the bump protection occur, and therefore, the connection reliability of the bump is decreased.

Third, when a bump material which does not melt upon the bonding such as the copper bump is used, it is required to completely equalize heights of the metal wiring 201 and the protection film 310 or heights of the bump electrode 231 and the dummy bump 241 to each other. The melting point of copper is high, and the copper is not in a melting state at a typical bonding temperature (400° C. or lower). Therefore, unless a total height of the bump electrode 231 and the metal wiring 201 and a total height of the dummy bump 241 and the protection film 310 are uniformed to each other, the load applied to the bump electrode is varied upon the sticking of the silicon substrates, and therefore, the connection reliability of the bump is decreased.

A preferred aim of the present invention is to solve the above-described problems, and, in a semiconductor device using copper which has a superior Electromigration reliability as the material of the bump electrode, to achieve the bump bonding with the high connection reliability and the bump protection by the high heat-resistant polymer film without excessively increasing the load required upon the sticking of the silicon substrates.

That is, the preferred aim of the present invention is to improve the reliability of the semiconductor device.

The above and other preferred aims and novel characteristics of the present invention will be apparent from the description of the present specification and the accompanying drawings.

The typical ones of the inventions disclosed in the present application will be briefly described as follows.

A semiconductor device according to an invention of the present application includes: a first substrate on whose one surface a first electrode and a first insulating film are formed; and a second substrate on whose one surface a second electrode and a second insulating film are formed, and the first substrate and the second substrate being layered and being electrically connected to each other by bonding the one surface of the first substrate and the one surface of the second substrate. The first electrode is formed in a first region of the first insulating film, a first dummy bump made of the same material as that of the first electrode is formed in a second region of the first insulating film, the second electrode is formed in a first region of the second insulating film, and a second dummy bump made of the same material as that of the second electrode is formed in a second region of the second insulating film. In a direction vertical to the one surface of the first substrate, a distance from the one surface of the first substrate to an upper surface of the first electrode, a distance from the one surface of the first substrate to an upper surface of the first dummy bump, and a distance from the one surface of the first substrate to an upper surface of the first insulating film are equal to each other. In a direction vertical to the one surface of the second substrate, a distance from the one surface of the second substrate to an upper surface of the second electrode, a distance from the one surface of the second substrate to an upper surface of the second dummy bump, and a distance from the one surface of the second substrate to an upper surface of the second insulating film are equal to each other. The first dummy bump is in contact with the second insulating film, the second dummy bump is in contact with the first insulating film, and the first insulating film and the second insulating film contain at least one of polyimide, polybenzoxazole, and benzocyclobutene.

Also, in a method of manufacturing a semiconductor device according to an invention of the present invention, the semiconductor device including: a first substrate on whose one surface a first electrode, a first dummy bump, and a first insulating film are formed; a second substrate on whose one surface a second electrode, a second dummy bump, and a second insulating film are formed, the first substrate and the second substrate being layered and being electrically connected to each other by bonding the one surface of the first substrate and the one surface of the second substrate, a step of forming the first electrode and the first dummy bump includes: (a1) a step of forming the first insulating film on the one surface of the first substrate; (a2) a step of forming an opening portion in each of a first region and a second region of the first insulating film; (a3) a step of burying a first conductive film inside the opening portion of each of the first region and the second region with; and (a4) a step of forming the first electrode formed of the first conductive film inside the opening portion of the first region and forming the first dummy bump formed of the first conductive film inside the opening portion of the second region by continuing to polish the first conductive film by using a chemical mechanical polishing method until there is no height difference (step) between an upper surface of the first insulating film and an upper surface of the first conductive film buried inside the opening portion of each of the first region and the second region. In the method, a step of forming the second electrode and the second dummy bump includes: (b1) a step of forming the second insulating film on the one surface of the second substrate; (b2) a step of forming an opening portion in each of a third region and a fourth region of the second insulating film; (b3) a step of burying a second conductive film inside the opening portion of each of the third region and the fourth region by a second conductive film; and (b4) a step of forming the second electrode formed of the second conductive film inside the opening portion of the third region and forming the second dummy bump formed of the second conductive film inside the opening portion of the fourth region by continuing to polish the second conductive film until there is no height difference between an upper surface of the second insulating film and an upper surface of the second conductive film buried in each opening portion of the third region and the fourth region by using a chemical mechanical polishing method. And, after the step of (a4) and the step of (b4), when the one surface of the first substrate and the one surface of the second substrate are bonded, the first dummy bump is bonded to the second insulating film, and the second dummy bump is bonded to the first insulating film.

The effects obtained by typical aspects of the present invention disclosed in the present application will be briefly described below.

According to the present invention, a connection reliability of a bump electrode for electrically connecting substrates to each other can be improved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, in the following embodiments, the description for the same or similar components will not be repeated in principle unless particularly required.

Also, in some drawings used in the following embodiments, hatching is partially added even in a plan view so as to make the drawings easy to see.

(First Embodiment)

A semiconductor device according the present embodiment is a layered-type semiconductor device obtained by bonding two silicon wafers on whose main surfaces a plurality of bump electrodes and a polymer film for surrounding their peripheries are formed, and electrically connecting integrated circuits to each other formed on the respective silicon wafers via a bump electrode.

Figure 4:
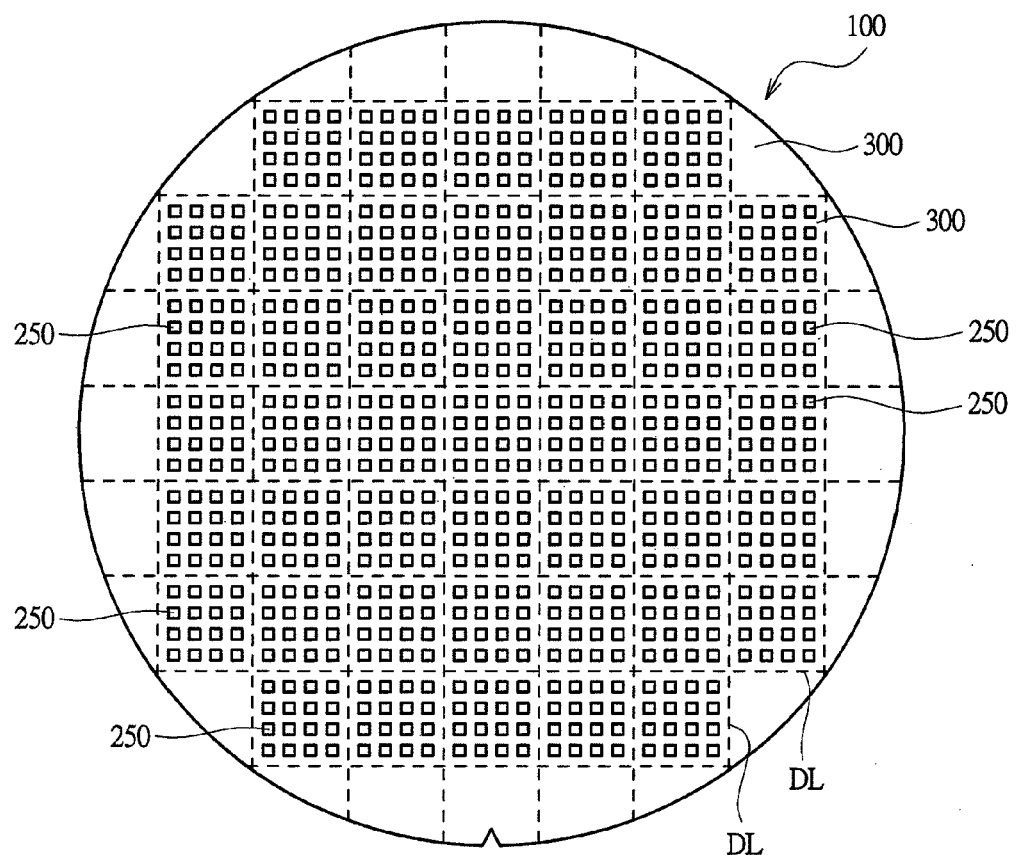
FIG. 4 is a planar layout of the layered semiconductor in the step of manufacturing the layered semiconductor illustrated in FIG. 3.
Figure 5:
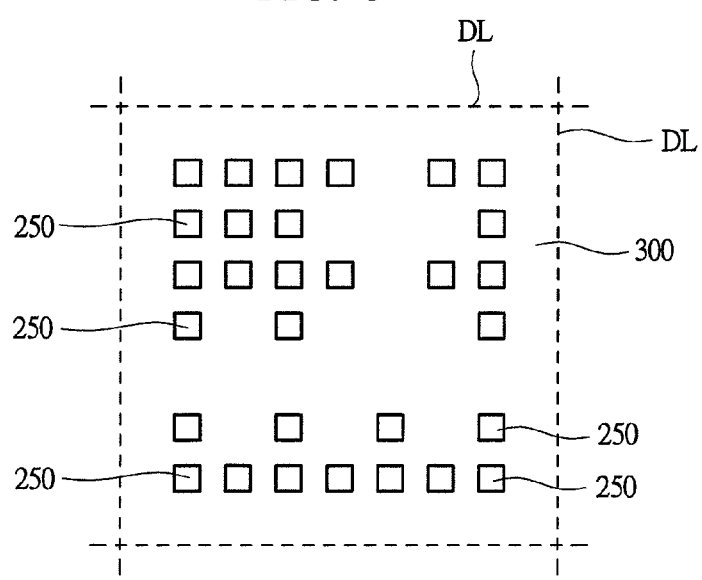
FIG. 5 is an enlarged planar layout illustrating a part of FIG. 4.
Figure 6:
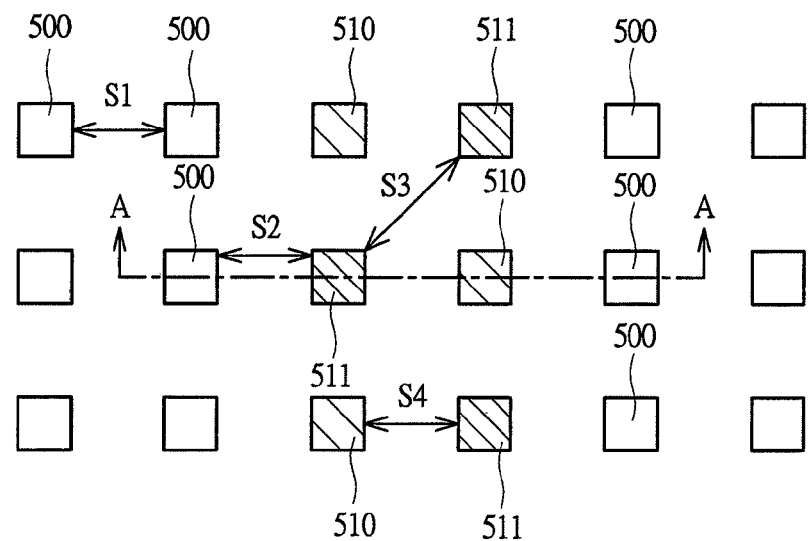
FIG. 6 is a planar layout explaining the method of manufacturing the layered semiconductor, continued from FIG. 3.

Hereinafter, with reference to FIGS. 1 to 9, a method of manufacturing the semiconductor device of the present embodiment will be explained in an order of steps. FIGS. 1 to 3, 7 and 8 are cross-sectional views of principal parts each explaining a manufacturing step for a layered semiconductor according to the first embodiment of the present invention, FIGS. 4 to 6 are planar layouts illustrating arrangement of the bump of the layered semiconductor during the manufacturing step, and FIG. 9 is a planar layout illustrating a modification example of the semiconductor device of the present embodiment.

Figure 1:
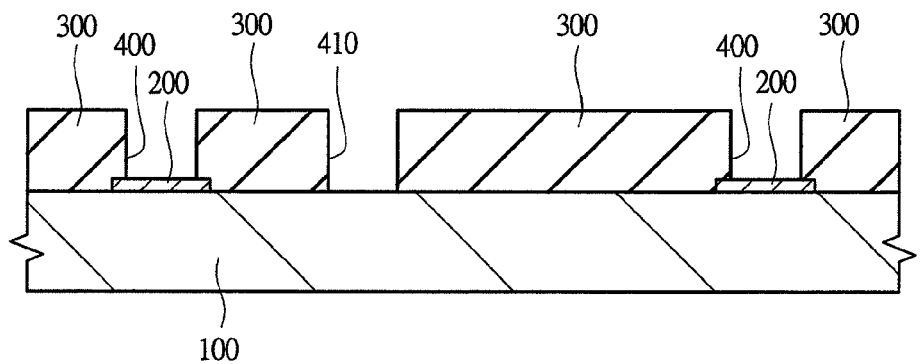
FIG. 1 is a cross-sectional view of a principal part explaining a step of manufacturing a layered semiconductor according to a first embodiment of the present invention.

First, as illustrated in FIG. 1, a first silicon substrate 100 on whose main surface a metal wiring 200 is formed is prepared, and a heat-resistant polymer film 300 is formed on the main surface so as to cover the metal wiring 200. Then, a bump opening portion 400 is formed by using photolithography and etching techniques so that a part of the metal wiring 200 is exposed, and a dummy bump opening portion 410 is formed by the same processes so that a part of the main surface of the first silicon substrate 100 which is a region except for the metal wiring 200 is exposed. The heat-resistant polymer film 300 is made of, for example, an insulating material mainly containing polybenzoxazole (PBO), and its thickness is set to 5 μm here.

Also, the first silicon substrate 100 is a silicon substrate on which so-called previous (front-end) process is completed, and, in a predetermined region thereof, an integrated circuit formed of semiconductor elements, wirings for connecting them, and others is formed. Note that FIG. 1 illustrates only a part of the wiring (metal wiring 200) formed on the first silicon substrate 100, and illustrations of a semiconductor element, an interlayer insulating film, and others are omitted. That is, the first silicon substrate 100 includes the semiconductor element formed on the main surface of the substrate, the interlayer insulating film formed on the substrate so as to cover the semiconductor element, and others. The metal wiring 200 is formed above the interlayer insulating film so that the metal wiring 200 is electrically connected to the semiconductor element or others via a wiring formed inside the interlayer insulating film.

Note that the metal wiring 200 is a wiring obtained by, for example, forming a metal film mainly made of aluminum (Al) on the first silicon substrate 100 by a sputtering method, and then, patterning the metal film by using the photolithography and etching techniques.

Figure 2:
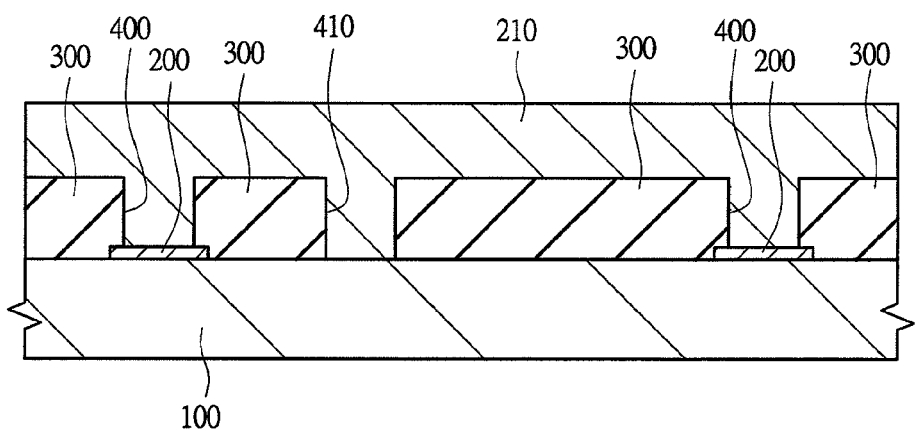
FIG. 2 is a cross-sectional view of a principal part explaining a method of manufacturing the layered semiconductor, continued from FIG. 1.

Next, as illustrated in FIG. 2, a TiN (titanium nitride) film having a thickness of about 70 nm and a metal film 210 formed of a copper film having a thickness of about 500 nm are sequentially stacked by the sputtering method from the first silicon substrate 100 side so as to cover an upper surface of the heat-resistant polymer film 300 and each inner wall and each base surface of the bump opening portion 400 and the dummy bump opening portion 410. This TiN film has a function of ensuring bonding property of the copper film. Also, this TiN film is a barrier conductor film formed for preventing diffusion of the copper film, which is buried inside the bump opening portion 400 and the dummy bump opening portion 410, into the heat-resistant polymer film 300 in a later step. This barrier conductor film may be made of a metal with a high melting point and its chemical compound. The barrier conductor film may be, for example, a layered film of a TiN film and a Ti film.

As described above, by interposing the TiN film between the copper film and the heat-resistant polymer film 300, between the copper film and the metal wiring 200, and between the copper film and the first silicon substrate 100, the bonding property of the copper film with each of the heat-resistant polymer film 300, the metal wiring 200, and the first silicon substrate 100 is improved. Note that FIG. 2 collectively illustrates the TiN film and the copper film as a metal film 210.

Figure 3:
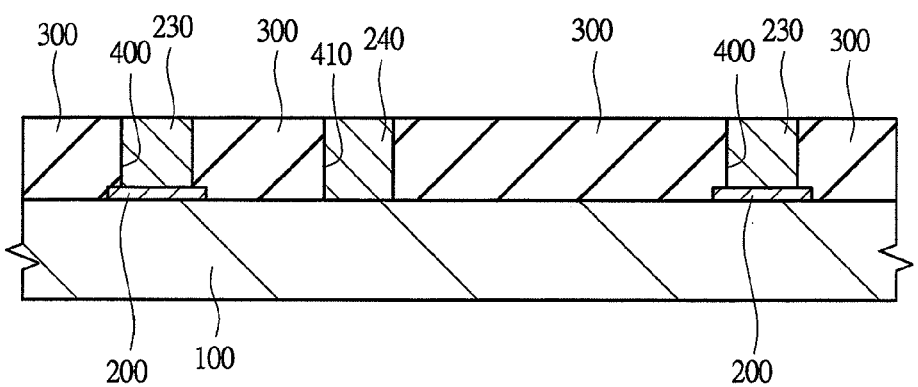
FIG. 3 is a cross-sectional view of a principal part explaining the method of manufacturing the layered semiconductor, continued from FIG. 2.

Next, as illustrated in FIG. 3, the copper film and the metal film 210 formed of the TiN film above the heat-resistant polymer film 300 are polished by using the CMP method, so that an upper surface of the heat-resistant polymer film 300 is exposed. Then, the polishing is continued until there is no height difference between the upper surface of the heat-resistant polymer film 300 and the upper surfaces of the copper film and the metal film 210 formed of the TiN film buried inside the bump opening portion 400.

Up to this step, a bump electrode 230 formed of the metal film 210 buried inside the bump opening portion 400 formed in the heat-resistant polymer film 300 and the dummy bump 240 formed of the metal film 210 buried inside the dummy bump opening portion 410 are formed. The bump electrode 230 is electrically connected to the metal wiring 200, which is formed on a base surface thereof, so as to be electrically connected to the semiconductor element (not illustrated) or others formed on the first silicon substrate 100 via the metal wiring 200. On the other hand, a base surface of the dummy bump 240 is not electrically connected to the metal wiring 200, and is in contact with the interlayer insulating film (not illustrated) which is formed on the upper surface of the first silicon substrate 100. Each side surface of the bump electrode 230 and the dummy bump 240 is covered by the above-described barrier conductor film, and is not directly in contact with the peripheral heat-resistant polymer film 300.

The dummy bump 240 is electrically insulated from other electrode, wiring, or others so as not to be connected to a circuit in the semiconductor device, and therefore, is a conductive later which is electrically meaningless. However, by excessively polishing the upper surface of the heat-resistant polymer film 300 in the polishing step by the above-described CMP method, the dummy bump 240 plays a role of preventing a state that the height of the upper surface of the heat-resistant polymer film 300 is lower than the height of an upper surface of the bump electrode 230.

If the heat-resistant polymer film 300 is formed in a wide area without including the bump electrode 230 and the dummy bump 240, the height of the upper surface of the heat-resistant polymer film 300 is lower than the height of the upper surface of the bump electrode 230. This is because the heat-resistant polymer film 300 has a property of being cut off by the CMP method easier than the bump electrode 230 or the dummy bump 240 which is made of metal such as copper.

Figure 20:
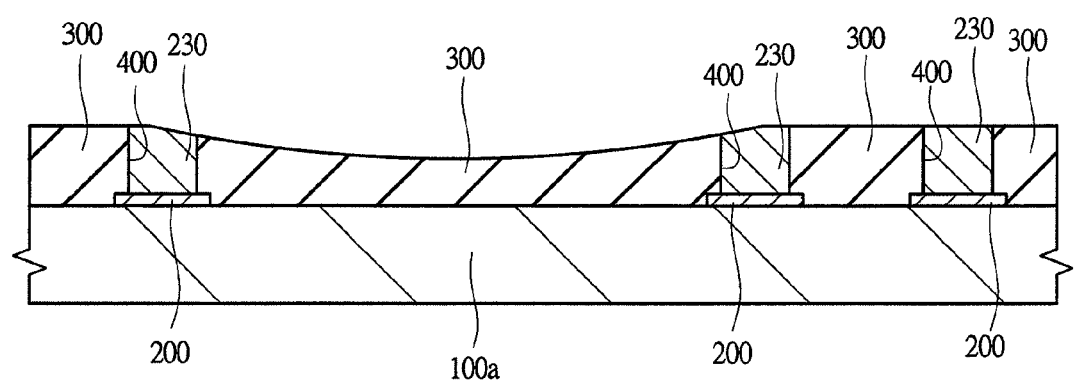
FIG. 20 is a cross-sectional view of a principal part of the semiconductor device during a manufacturing step illustrated as the comparison example.

For example, as illustrated in FIG. 20 as a comparison example, when a metal layer such as the dummy bump is not formed but only a polymer film such as the heat-resistant polymer film 300 which is polished by the CMP method easier than the metal layer is formed in the wide area between the adjacent bump electrodes 230, the heat-resistant polymer film 300 is polished so that the upper surface thereof becomes concave, and therefore, the heights of the upper surfaces of the heat-resistant polymer film 300 and other bumps are not uniformed to each other. Note that FIG. 20 is a cross-sectional view of a principal part in a manufacturing step for a layered semiconductor illustrated as the comparison example. A semiconductor device during the manufacturing step illustrated in FIG. 20 is formed by the almost same method as the method described with reference to FIGS. 1 to 3, and includes a heat-resistant polymer film 300 which is formed on a silicon substrate 100a, and a bump electrode 230 which is buried in an opening portion 400 of the heat-resistant polymer film and is electrically connected to the metal wiring 200 formed in a base of the opening portion 400. However, as different from the semiconductor device during the manufacturing step illustrated in FIG. 3, the dummy bump is not formed in the semiconductor device during the manufacturing step illustrated in FIG. 20 as the comparison example.

In this case, when the silicon substrate 100a and another silicon substrate are stuck to each other to form the layered semiconductor in a later step, there is such a problem that the heat-resistant polymer film 300 whose upper surface is concave is not bonded to the another silicon substrate at an interface with the another silicon substrate, and therefore, the bonding reliability of the silicon substrates bonded to each other is decreased. Note that the stuck silicon substrates are electrically connected to each other via the bump electrodes 230 which are formed at their interfaces.

However, if the bonding property of the heat-resistant polymer film 300 deteriorates as described above, the connection reliability of the bump electrode 230 for electrically connecting the silicon substrates stuck to each other is also decreased, and therefore, there is such a risk that the semiconductor device does not operate normally. Further, as illustrated in FIG. 20, there is such a risk that a part of an upper portion of the bump electrode 230 which is formed adjacent to an end portion of an upper surface of the heat-resistant polymer film 300 polished so as to be concave is polished easily by cutting off an upper portion of the adjacent heat-resistant polymer film 300 so that the height of the upper surface of the bump electrode 230 is lower than heights of upper surfaces of other bump electrodes 230. Also in this case, the connection reliability of the bump electrode 230 formed on each of the silicon substrates stuck to each other when the layered semiconductor is formed is decreased.

In the semiconductor device of the present embodiment, it is prevented that the height of the heat-resistant polymer film 300 is lower than the height of the bump in the polishing step by appropriately arranging the dummy bump 240 in the same layer as the bump electrode 230 even in an area in a vicinity of which the bump electrode 230 is not arranged as illustrated in FIG. 3. That is, the heights of the upper surfaces of the bump electrode 230, the dummy bump 240, and the heat-resistant polymer film 300 are equalized to each other, so that a surface including each of the upper surfaces of the bump electrode 230, the dummy bump 240, and the heat-resistant polymer film 300 can be planarized. That is, in a direction vertical to the main surface of the first silicon substrate 100, it is possible to equalize a distance from the main surface of the first silicon substrate 100 to the upper surface of the bump electrode 230, a distance from the main surface of the first silicon substrate 100 to the upper surface of the dummy bump 240, and a distance from the main surface of the first silicon substrate 100 to the upper surface of the heat-resistant polymer film 300. In other words, the planar surface including each of the upper surfaces of the bump electrode 230, the dummy bump 240, and the heat-resistant polymer film 300 can be formed along the main surface of the first silicon substrate 100.

FIG. 4 is a planar layout illustrating a plurality of bumps 250 including the heat-resistant polymer film 300, the bump electrode 230 (see FIG. 3), and the dummy bump 240 (see FIG. 3) which are formed on the first silicon substrate 100, and FIG. 5 is an enlarged planar layout illustrating a part of a region in FIG. 4 which is a region divided by dicing lines DL to form one chip in a later step.

As illustrated in FIGS. 4 and 5, the bumps 250 are formed in a lattice-like pattern along the dicing lines DL in the first silicon substrate 100. That is, the bumps 250 are formed so that a plurality thereof are arranged in a first direction that is a direction along the main surface of the first silicon substrate 100, and also a plurality thereof are arranged in a second direction that is vertical to the first direction and along the main surface of the first silicon substrate 100. However, as illustrated in FIG. 5, the bumps 250 are not necessarily arranged at constant intervals in the first direction, and are not necessarily arranged at constant intervals in the second direction, either. Note that the dicing lines DL are indicated by broken lines in FIGS. 4 and 5.

Next, a second silicon substrate 101 including an integrated circuit formed in its predetermined region is prepared, and the second silicon substrate 101 is subjected to the same steps as illustrated in FIGS. 1 to 5. That is, after forming a bump opening portion 400 and a dummy bump opening portion 410 in a heat-resistant polymer film 300 formed on the second silicon substrate 101, a bump electrode 230 is formed inside the bump opening portion 400. Also, a dummy bump 240 is formed inside the dummy bump opening portion 410. A metal wiring 200 is formed between an upper surface of the second silicon substrate 101 and the bump electrode 230, so that the bump electrode 230 is electrically connected to the integrated circuit or others formed on the second silicon substrate 101 via the metal wiring 200.

Since the bump electrode 230 and the dummy bump 240 on the second silicon substrate 101 are formed similarly to the bump electrode 230 and the dummy bump 240 on the first silicon substrate 100, the heights of the upper surfaces of the bump electrode 230 and the dummy bump 240 on the second silicon substrate 101 are equal to each other. That is, a surface including each of the upper surfaces of the bump electrode 230 and the dummy bump 240 on the second silicon substrate 101 is a planar surface, and is formed in parallel to a main surface of the second silicon substrate 101.

Figure 7:
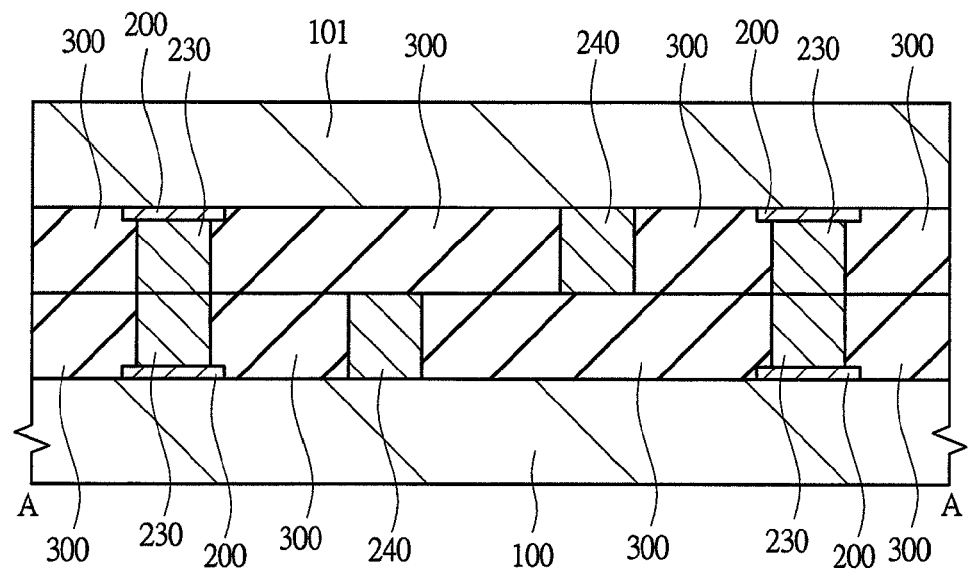
FIG. 7 is a cross-sectional view of a principal part in a line A-A of FIG. 6.

Next, as illustrated in FIGS. 6 and 7, the first silicon substrate 100 and the second silicon substrate 101 are overlapped with each other, and heated and pressure-bonded so that the bump electrodes 230 formed on the respective main surfaces of the two silicon substrates are electrically connected to each other simultaneously with the bonding of the heat-resistant polymer films 300. That is, the main surface side of the first silicon substrate 100 and the main surface side of the second silicon substrate 101 are opposite to each other so that the first silicon substrate 100 and the second silicon substrate 101 are stuck and bonded.

FIG. 6 is a planar layout of each bump at bonding surfaces (interfaces) of the first silicon substrate 100 (not illustrated) and the second silicon substrate 101 (not illustrated). FIG. 6 illustrates only bonding surfaces of the bump electrodes 230 and the dummy bumps 240, and does not illustrate a bonding surface of the heat-resistant polymer film 300 and others. That is, FIG. 6 is a view illustrating arrangement of the bump electrodes 230 and the dummy bumps 240 in planar view formed on the main surfaces of both of the silicon substrates obtained when the first silicon substrate 100 and the second silicon substrate 101 are stuck to each other. FIG. 7 is a cross-sectional view of a principal part of a layered semiconductor formed by sticking the first silicon substrate 100 and the second silicon substrate 101, and corresponds to a cross-sectional view of a principal part taken along line A-A in FIG. 6.

As illustrated in FIG. 7, when the first silicon substrate 100 and the second silicon substrate 101 are bonded to each other to form the layered semiconductor, pressure is applied from rear surfaces of the respective silicon substrates to be pressure-bonded under a state that the main surfaces of the silicon substrates are opposite to and in contact with each other. At this time, the upper surface of each dummy bump 240 formed on both of the first silicon substrate 100 and the second silicon substrate 101 is bonded to the upper surface of the heat-resistant polymer film 300. That is, the upper surface of the dummy bump 240 formed on the main surface of the first silicon substrate 100 is not bonded to the dummy bump 240 or the bump electrode 230 formed on the main surface of the second silicon substrate 101, but is bonded to the heat-resistant polymer film 300 formed on the main surface of the second silicon substrate 101. Similarly, the upper surface of the dummy bump 240 formed on the main surface of the second silicon substrate 101 is not bonded to the dummy bump 240 or the bump electrode 230 formed on the main surface of the first silicon substrate 100, but is bonded to the heat-resistant polymer film 300 formed on the main surface of the first silicon substrate 100. The bump electrodes 230 are more firmly bonded to each other at a higher temperature and with a higher pressure, and the connection reliability is higher. Here, in point of views of a heat resistance (thermal decomposition temperature) of the polymer film and performance of a machine for sticking the silicon substrates, a temperature upon the pressure-bonding is set at 350° C., and a load applied to both of the silicon substrates is set at 30 kN.

The respective upper surfaces of the bump electrode 230, the dummy bump 240, and the heat-resistant polymer film 300 formed on the first silicon substrate 100 are included in a planarized surface in parallel to the main surface of the first silicon substrate 100, and, similarly, the respective upper surfaces of the bump electrode 230, the dummy bump 240, and the heat-resistant polymer film 300 formed on the second silicon substrate 101 are included in a planarized surface in parallel to the main surface of the second silicon substrate 101. That is, in the above-described layered semiconductor, a bonding interface between the surface including the respective upper surfaces of the bump electrode 230, the dummy bump 240, and the heat-resistant polymer film 300 formed on the first silicon substrate 100 and the surface including the respective upper surfaces of the bump electrode 230, the dummy bump 240, and the heat-resistant polymer film 300 formed on the second silicon substrate 101 is a planarized surface in parallel to the main surface of the first silicon substrate 100. In other words, a bonding interface between a first layer including the bump electrode 230, the dummy bump 240, and the heat-resistant polymer film 300 formed on the first silicon substrate 100 and a second layer including the bump electrode 230, the dummy bump 240, and the heat-resistant polymer film 300 formed on the second silicon substrate 101 is a planar surface in parallel to the main surface of the first silicon substrate 100.

Therefore, there are no voids between the first silicon substrate 100 and the second silicon substrate 101 which configures the layered semiconductor in which the respective main surfaces of the first silicon substrate 100 and the second silicon substrate 101 are bonded to each other, so that sufficient bonding strength is provided between the heat-resistant polymer films 300 and between the bump electrodes 230 formed on the respective substrates.

FIG. 6 illustrates a contact interface between the bump electrode 230 formed on the first silicon substrate 100 and the bump electrode 230 formed on the second silicon substrate 101 illustrated in FIG. 7 as a bump electrode 500. That is, a layout pattern of the bump electrodes 500 is a pattern of the upper surfaces of the bump electrodes 230.

Similarly, FIG. 6 illustrates a contact interface between the dummy bump 240 formed on the first silicon substrate 100 and the heat-resistant polymer film 300 formed on the second silicon substrate 101 as a dummy bump 510. That is, a layout pattern of the dummy bumps 510 is a pattern of the upper surfaces of the dummy bumps 240 formed on the first silicon substrate 100.

Similarly, FIG. 6 illustrates a contact interface between the dummy bump 240 formed on the second silicon substrate 101 and the heat-resistant polymer film 300 formed on the first silicon substrate 100 as a dummy bump 511. That is, a layout pattern of the dummy bumps 511 is a pattern of the upper surfaces of the dummy bumps 240 formed on the second silicon substrate 101.

As illustrated in FIG. 6, in order to bond the bump electrodes to each other, the respective layout patterns (bump electrodes 500) of the bump electrodes 230 (see FIG. 7) on the first silicon substrate 100 and the second silicon substrate 101 overlap with each other. That is, the layout patterns (bump electrodes 500) that are the layouts of the bump electrodes 230 are arranged so that the bump electrodes 230 are opposite to each other when the main surfaces of the silicon substrates configuring the layered semiconductor are opposite to each other. Therefore, when the silicon substrates are stuck to each other, the respective bump electrodes 230 formed on the first silicon substrate 100 and the second silicon substrate 101 are connected to each other.

On the other hand, the layout patterns (dummy bumps 510) of the dummy bumps 240 (see FIG. 7) on the first silicon substrate 100 and the layout patterns (dummy bumps 511) of the dummy bumps 240 (see FIG. 7) on the second silicon substrate 101 are arranged so that they do not overlap with each other in plan view when the main surfaces of the silicon substrates configuring the layered semiconductor are opposite to each other. Therefore, when the silicon substrates are stuck to each other, the respective dummy bumps 240 formed on the first silicon substrate 100 and the second silicon substrate 101 are not connected to each other.

In the plan layout of the dummy bumps illustrated in FIG. 6, the dummy bumps 510 and 511 and the bump electrodes 500 are arranged in a lattice-like (matrix) pattern in which a bump located on a different silicon substrate is arranged at the closest positions of a certain dummy bump in the first and the second directions. That is, a plurality of bumps are arranged at predetermined equal intervals in the first direction, and a plurality of bumps are also arranged at predetermined equal intervals in the second direction.

Here, the shortest distance between the bump electrodes 500 is defined as "S1", the shortest distance between the bump electrode 500 and the dummy bump 510 is defined as "S2", and the shortest distance between the dummy bumps 510 on the same silicon substrate is defined as "S3". Further, the shortest distance between the dummy bump 510 and the dummy bump 511 formed on the respective different silicon substrates of the first silicon substrate 100 and the second silicon substrate 101 is defined as "S4". In the present embodiment, lengths of S2 and S4 are set to be equal to a length of S1.

Figure 8:
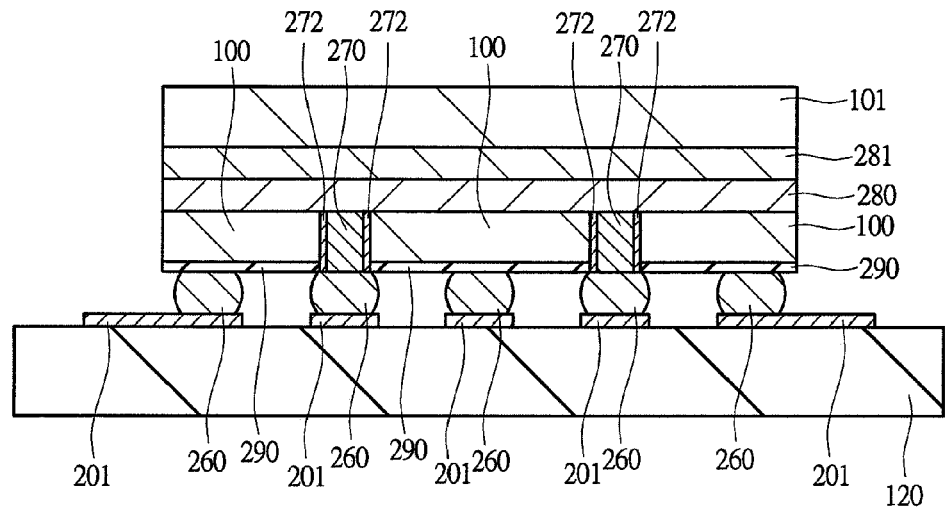
FIG. 8 is a cross-sectional view of a principal part explaining the method of manufacturing the layered semiconductor, continued from FIG. 6.
Figure 9:
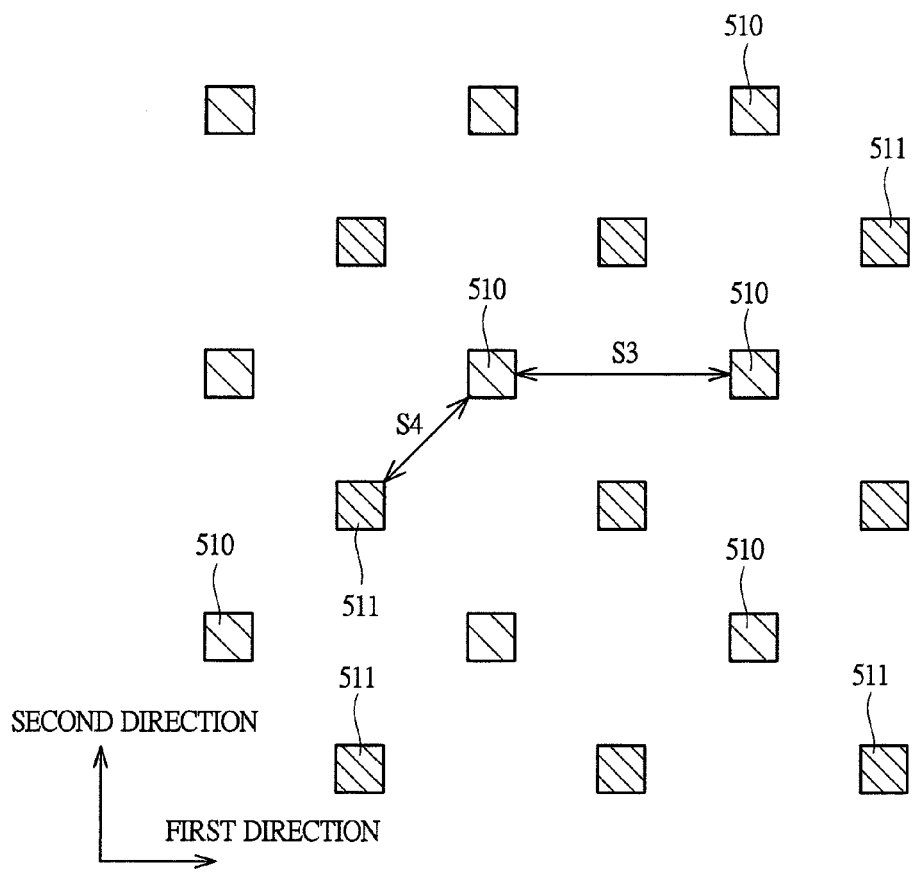
FIG. 9 is a planar layout illustrating a modification example of a semiconductor device according to the first embodiment of the present invention.

Next, as illustrated in FIG. 8, by using photolithography and dry etching techniques for the layered semiconductor illustrated in FIG. 7, a rear-surface insulating film 290 is formed on a surface (rear surface) of the first silicon substrate 100 where the semiconductor element is not formed. Subsequently, an opening portion (silicon through-hole) is provided from a bottom portion of the rear-surface insulating film 290 toward a surface (front surface) where the semiconductor element is formed. That is, the silicon through-hole penetrates through the rear-surface insulating film 290 so as to reach an inner portion of the first silicon substrate 100 from the rear surface of the first silicon substrate 100. Note that the rear surface of the first silicon substrate 100 may be thinned before forming the rear-surface insulating film 290 if needed.

Subsequently, a silicon oxide film is formed by using the chemical vapor deposition (CVD) method so as to cover an inner wall of the silicon through-hole. However, at this time, the above-described silicon oxide film is formed so as not to be completely buried in the silicon through-hole. Then, the oxide film on a bottom portion of the silicon through-hole is removed by using the dry etching technique to form an insulating film 272 which is formed of the silicon oxide film on the inner wall of the silicon through-hole. Subsequently, a barrier metal film made of TiN and a copper film are sequentially buried inside the silicon through-hole by using a sputtering method and a plating method.

Subsequently, the barrier metal film made of TiN and the copper film, which are formed on the rear surface of the first silicon substrate 100, are removed by using the CMP method to expose the rear-surface insulating film 290 and form a through electrode 270 which penetrates the rear-surface insulating film 290 for electrical connection from the rear surface of the first silicon substrate 100 to the semiconductor element formed on the front surface of the first silicon substrate 100. As described above, a method of forming the through electrode 270 after the completion of formation (so-called pre-process) of the semiconductor element or the metal wiring is generally called a via-last method. The method of forming the through electrode is substantially similar to the method of forming the bump described with reference to FIGS. 1 to 3. However, by forming the insulating film 272 between the through electrode 270 and the first silicon substrate 100, electrical conduction between the through electrode 270 and the first silicon substrate 100 is prevented.

Subsequently, a solder bump 260 is formed on the rear surface of the first silicon substrate 100 on which the through electrode 270 is formed, and then, the layered semiconductor device is singulated (diced) into a plurality of chips (semiconductor chips) by a dicing machine.

Subsequently, the singulated chip is mounted by a flip-chip bonder on a package substrate 120 on which a metal wiring 201 is formed, and the solder bump 260 and the metal wiring 201 are electrically connected to each other, so that the semiconductor device of the present embodiment is completed. Note that the through electrode 270 is not directly in contact with a conductor film formed in contact with the main surface of the first silicon substrate 100 or a conductor such as the bump electrode 230 formed on the second silicon substrate 101. Here, the through electrode 270 is a wiring which is formed via a contact plug to an electrode included in the semiconductor element or others on the main surface of the first silicon substrate 100 and is an electrode in contact with a wiring formed on a lower layer than the heat-resistant polymer film 300 to be electrically connected to the semiconductor element.

The rear-surface insulating film 290 is provided to prevent the electrical conduction between the solder bump 260 and the first silicon substrate 100. The solder bump 260 is formed so as to have a larger width than the through electrode 270 in a direction along the main surface of the first silicon substrate 100. Therefore, if the rear surface of the first silicon substrate 100 is not covered by the rear-surface insulating film 290, there is a risk that the solder bump 260 and the first silicon substrate 100 are electrically connected to each other, which results in non-normal operation of the semiconductor device.

Further, FIG. 8 illustrates a layer including the heat-resistant polymer film 300, the bump electrode 230, and the dummy bump 240 formed on the first silicon substrate 100 as a bump forming layer 280. Similarly, it illustrates a layer including the heat-resistant polymer film 300, the bump electrode 230, and the dummy bump 240 formed on the second silicon substrate 101 as a bump forming layer 281.

In the semiconductor device manufactured as described above, the first silicon substrate 100 and the second silicon substrate 101 are bonded to each other by the heat-resistant polymer films, the bump electrodes, and the dummy bumps formed on the respective silicon substrates, that is, by the bump forming layer 280 and the bump forming layer 281 thereon, and the semiconductor elements formed on the respective silicon substrate are electrically connected to an outsides of the semiconductor device via the bump electrode 230 (not illustrated), the through electrode 270, the solder bump 260, and the metal wiring 270 formed on the package substrate 120.

Next, effects of the semiconductor device of the present embodiment will be explained with reference to a comparison example 1 and a comparison example 2. The semiconductor devices of the comparison example 1 and the comparison example 2 are semiconductor devices having no difference in the manufacturing process and the layout from the semiconductor device of the present embodiment except for difference in the arrangement of the bumps. More specifically, the comparison example 1 is a semiconductor device without dummy bumps at all, and the comparison example 2 is a semiconductor device with dummy bumps formed on the respective first and the second silicon substrates so as to be bonded to each other when the silicon substrates are stuck to each other.

The present inventors have evaluated the voids (airspaces, spaces) caused in the bonding surface of the layered semiconductor by using an infrared microscope and a scanning electron microscope (SEM) for the semiconductor devices of the comparison example 1 and the comparison example 2 formed as described above. As a result, in the comparison example 1, an uneven white contrast has been observed in a region in vicinity of which there are no bumps and where the polymer films should be bonded to each other. However, in the semiconductor device of the present embodiment and the semiconductor device of the comparison example 2, such an uneven white contrast has not been observed.

From observation of a cross-sectional surface in the vicinity of the bonding surface of the comparison example 1 by the SEM, it has been found that there are the voids between the heat-resistant polymer films on the respective silicon substrates, and that the uneven white contrast observed by an ultrasonic testing machine has appeared due to the spaces (airspaces) caused between the polymer films. On the other hand, when the semiconductor devices of the present embodiment and the comparison example 2 have been similarly observed, the voids have not been observed between the polymer films. A reason why the voids are caused between the heat-resistant polymer films in the comparison example 1 as described above is that the dummy bumps are not provided in the comparison example 1 in a polishing step corresponding to the step described with reference to FIG. 3, and therefore, a large region in a vicinity of which the dummy bump or the bump electrode is not provided is formed, and the surface of the heat-resistant polymer film in the region is excessively polished.

Since the heat-resistant polymer film has a property which tends to be polished by the CMP method easier than the bump electrode and the dummy bump mainly made of metal, there is such a possibility that the upper surface of the heat-resistant polymer film is lower than the upper surface of the bump in a region having a low bump density to form a concave shape. As described above, even if the main surfaces of the silicon substrates in which the surface of the heat-resistant polymer film is concave such that the heights of the heat-resistant polymer film and the bump are not uniformed are bonded so as to be opposite to each other, a sufficient bonding area cannot be secured due to the concaves of the heat-resistant polymer films, and therefore, the bonding strength is lowered. In a semiconductor device whose bonding reliability is low because of the low bonding strength, the bonded silicon substrates tend to peel from each other, and therefore, there is a problem that the electrical connection between the bump electrodes is cut off, which results in the non-normal operation of the semiconductor device.

As described above, in the semiconductor device having the layered semiconductor formed by bonding the silicon substrates to each other, it is important to equalize the distances from the respective upper surfaces of the heat-resistant polymer film, the bump electrode, and the dummy bump formed on the first silicon substrate to the first silicon substrate in order to improve the bonding reliability. Similarly, it is important to equalize the distances from the respective upper surfaces of the heat-resistant polymer film, the bump electrode, and the dummy bump formed on the second silicon substrate to the second silicon substrate. In other words, it is preferred that the heights of the upper surfaces of the heat-resistant polymer film, the bump electrode, and the dummy bump formed on the respective silicon substrates are equalized to each other to be planarized.

Noted that the upper surface of the heat-resistant polymer film, the bump electrode, the dummy bump, or others in the present patent application means a distance from the main surface of the silicon substrate to the farthest surface among surfaces of the respective layers in a direction vertical to the main surface of the silicon substrate on which the layers are formed. However, the upper surface (uppermost surface) of each layer described above also includes a curved surface curving to have a difference in height. For example, when a surface positioned away from the bump farther than a surface in the vicinity of the bump is concave such as the heat-resistant polymer film of the semiconductor device of the above-described comparison example 1, a surface in the concave region is defined as a part of the upper surface of the heat-resistant polymer film. Since the plurality of dummy bumps are arranged at predetermined positions in the same layer as the heat-resistant polymer film in the present embodiment, there is no curved portion in the upper surface of the heat-resistant polymer film so as to be polished to be planarized. Therefore, the height of the upper surface of the heat-resistant polymer film is not lower than the height of the upper surface of the bump in any region.

Note that an upper surface of a layer formed on a main surface of a substrate whose main surface faces downward in its cross-sectional view, such as the second silicon substrate 101 illustrated in FIG. 6 or 8, is explained as facing downward in the drawings. That is, in FIG. 8, the main surface of the second silicon substrate 101 is positioned closer to the first silicon substrate 100 than the rear surface of the second silicon substrate 101, and the upper surface of the bump forming layer 281 formed on the main surface of the second silicon substrate 101 is provided below the second silicon substrate 101. Therefore, the upper surface of the bump forming layer 281 on the second silicon substrate 101 is in contact with the upper surface of the bump forming layer 280 on the first silicon substrate 100.

Next, for the above-described semiconductor devices, a bonding state of the bump electrodes on the respective silicon substrates has been evaluated by using the scanning electron microscope. As a result, in the semiconductor device of the present embodiment and the semiconductor device of the comparison example 1, good bonding state has been confirmed between the bump electrodes. On the other hand, in the semiconductor device of the comparison example 2, it has found that there is a space partially between the bump electrodes formed on the two respective silicon substrates, which results in not obtaining the sufficient bonding. This is because the number of connections between the dummy bumps has been significantly larger than the number of connections between the bump electrodes in the semiconductor device of the comparison example 2, and therefore, a load per bump electrode has been reduced when the silicon substrates are bonded to each other, and a secure bonding between the bonding surfaces of the bump electrodes could not have been obtained. As described above, in a case of increase in a ratio of an area where metal layers such as bumps, for example, made of copper are bonded to each other, there is a problem that the bump electrodes cannot be bonded to each other due to the low pressure applied to the respective bump electrodes, which results in non-normal operation of the semiconductor device.

Further, as a method of sticking a plurality of silicon substrates to each other, a method is considered, in which a bump electrode and a dummy bump are formed on one silicon substrate, a protection film and a metal wiring exposed from the protection film are formed on the other silicon substrate, and the bump electrode is bonded to the metal wiring and the dummy bump is bonded to the protection film upon the sticking of the silicon substrates, and, after the bonding, a polymer for the bump protection is injected into a space between the silicon substrates. However, this method has the following problems.

First, since the periphery of the bump is not protected by the insulating film upon the sticking of the silicon substrates, it is required to inject the polymer for the bump protection from the end portions of the silicon substrates after the sticking of the silicon substrates. Therefore, if the height of the bump is lowered to narrow the space between the silicon substrates, the space is not completely filled with the polymer injected from the end portions of the silicon substrates, and the airspace called void occurs inside the polymer, and therefore, the connection reliability of the bump is decreased.

Second, since the polymer for the bump protection is injected from the end portions of the stuck silicon substrates, it is required to keep a polymer viscosity low during the injection of the polymer. Generally, a low-viscosity polymer tends to have a low heat resistance. For example, in the Epoxy-based polymer of a representative example for the injected polymer, its thermal decomposition starts at about 250° C. to cause its volume shrinkage. Therefore, when a next silicon substrate is stuck after injecting the Epoxy-based polymer into the stuck silicon substrates, it is required to set a sticking temperature at 250° C. or lower. That is, after the sticking of the silicon substrates and the injection of the polymer, if the sticking is performed by the copper bump which requires a relatively high temperature, the volume shrinkage and alteration of the previously-formed polymer film for the bump protection occur, and therefore, the connection reliability of the bump is decreased.

Third, when a bump material which does not melt upon the bonding such as the copper bump is used, an action is required so that heights of the metal wiring and the protection film or heights of the bump electrode and the dummy bump are completely equal to each other. The melting point of copper is high, and the copper is not in a melting state at a typical bonding temperature (400° C. or lower). Therefore, unless a total height of the bump electrode and the metal wiring and a total height of the dummy bump and the protection film are uniformed to each other, the load applied to the bump electrode is varied upon the sticking of the silicon substrates, and therefore, the connection reliability of the bump is decreased.

The present invention is applied to a semiconductor device formed by bonding first and second silicon substrates each on which a heat-resistant polymer film is formed and which has a bump electrode whose height is equal to that of the heat-resistant polymer film, so as to electrically connect the bump electrodes to each other. When such bonding is performed, a dummy bump whose height is equal to that of the heat-resistant polymer film is provided in the vicinity of the bump electrode, and the dummy bump is bonded to the heat-resistant polymer film on the substrate opposite thereto as the first embodiment, so that a semiconductor device having a bonding surface with high connection reliability having both of good connection performance between the bump electrodes and bump protection by a polymer film with high heat resistance and without voids is achieved.

That is, by connecting the dummy bump formed on each silicon substrate to an insulating film (heat-resistant polymer film) formed on the opposite silicon substrate so as not to be connected to the dummy bump in the same layer as the insulating film, a bonding area between the bumps, that is, the metal layers on bonding surfaces of the silicon substrates configuring a layered semiconductor can be reduced. By reducing the bonding area between the metal layers, the load required for the bonding per bump electrode can be reduced. Therefore, even if a plurality of dummy electrodes are provided thereon, the silicon substrates can be bonded to each other by low load application, and the connection reliability between the bump electrodes can be improved.

Figure 18:
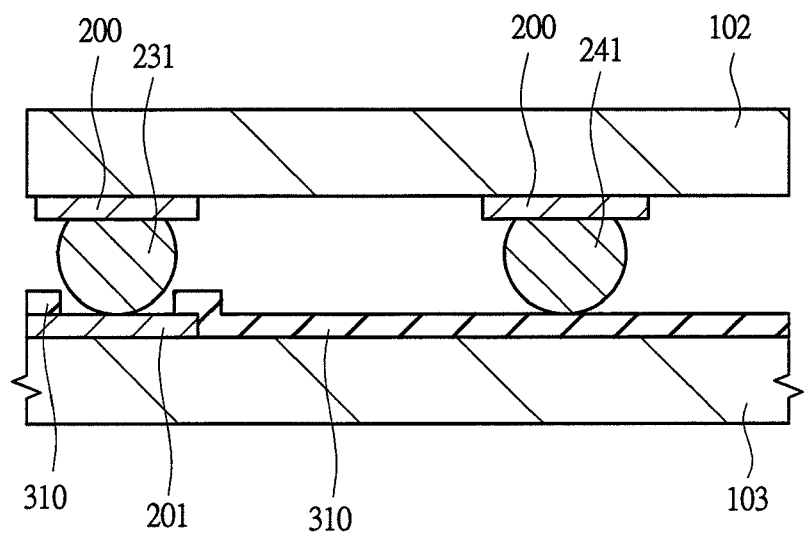
FIG. 18 is a cross-sectional view of a principal part explaining a method of manufacturing a semiconductor device illustrated as a comparison example.
Figure 19:
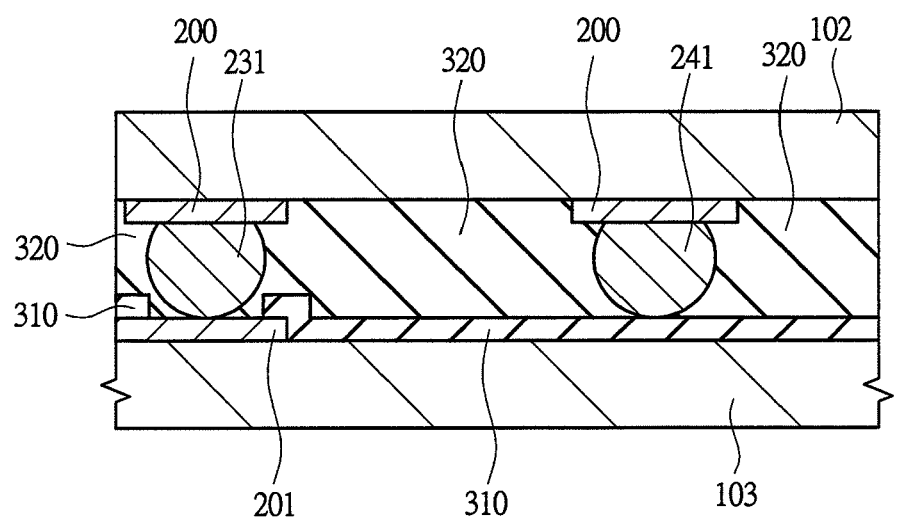
FIG. 19 is a cross-sectional view of a principal part explaining the method of manufacturing the semiconductor device, continued from FIG. 18.

As a method of bonding the main surface or the rear surface of one silicon substrate to the main surface or the rear surface of the other silicon substrate to electrically connect the respective silicon substrates via the bump electrode, a method is considered, in which a bump electrode 231 formed on one silicon substrate 102 is connected to a metal wiring 201 formed on the other silicon substrate 103 as illustrated in FIG. 18, and then, a polymer is flown in between the silicon substrates 102 and 103 so as to be buried therebetween as illustrated in FIG. 19. Note that each of FIGS. 18 and 19 is a cross-sectional view of a principal part for explaining the methods of manufacturing the semiconductor devices of the comparison examples.

At this time, it is considered that deflection of the silicon substrates due to the arrangement of the bumps is prevented by forming a dummy bump 241 on the silicon substrate 102 in the same layer as the bump electrode 231 as similarly to the bump electrode 231 so as to be connected to a protection film 310 formed on the silicon substrate 103 when the silicon substrates 102 and 103 are stuck to each other. In this case, it is required to form the dummy bump 241 so as to have the same height as the bump electrode 231, that is, the same distance as the bump electrode 231 from the main surface of the silicon substrate 102 in a direction vertical to the main surface of the silicon substrate 102, and therefore, the dummy bump 241 is arranged on the silicon substrate 102 via a metal electrode 200 similarly to the bump electrode 231.

In a case of bonding a silicon substrate 102 on which the bump electrode 231 and the dummy bump 241 are formed as described above to the other silicon substrate 103, and then, flowing and forming (filling with) the polymer such as an underfill polymer for the bump protection into a space between the silicon substrates 102 and 103, which is a region in the same layer as the bump electrode 231 and the dummy bump 241, there is a risk that the space cannot be completely buried by the polymer to form the airspace (void, space).

If the airspace is formed between the stuck silicon substrates, the bonding strength of the silicon substrates is lowered, and therefore, the bonded silicon substrates are peeled from each other, and the electrical connection between the bump electrode 231 and the metal wiring 201 is cut off, which results in the non-normal operation of the semiconductor device. Further, there is such a problem that the airspace is formed in contact with the bump electrode 231, moisture remain in the airspace corrodes the bump electrode 231, thereby blocking conduction of the bump electrode, which results in reduction in the reliability of the semiconductor device.

Further, since the polymer for the bump protection is injected from the end portions of the stuck silicon substrates, it is required to keep the viscosity of the polymer low during the polymer injection. Generally, a low-viscosity polymer tends to have low heat resistance. When an epoxy-based polymer or others which has low viscosity and results in volume shrinkage at about 250° C. is injected between the silicon substrates, it is required to set a temperature generated in a subsequent manufacturing step to be 250° C. or lower. That is, after the sticking of the silicon substrates and the injection of the polymer, when the sticking is performed by the copper bump which requires the relatively high temperature, the volume shrinkage and alteration of the polymer film for the previously-formed bump protection occur, and therefore, the connection reliability of the bump electrode is decreased.

Further, when a bump material which does not melt upon the sticking such as the copper bump is used, an action is required so that the heights of the metal wiring 201 and the protection film 310 or the heights of the bump electrode 231 and the dummy bump 241 are completely equal to each other. A melting point of copper is high, and copper is not in a melt state at a typical bonding temperature (400° C. or lower). Therefore, unless a total height of the bump electrode 231 and the metal wiring 201 and a total height of the dummy bump 241 and the protection film 310 are uniformed to each other, the load applied to the bump electrode is varied upon the sticking of the silicon substrates, and therefore, the connection reliability of the bump is decreased.

In the semiconductor device of the present embodiment, the bump electrode and the dummy bump are formed inside the opening portion formed in the heat-resistant polymer film, and the heat-resistant polymer films on the respective silicon substrates are also bonded to each other upon the bonding of the silicon substrates, and therefore, it is not required to inject the polymer from the end portions after the step of bonding the silicon substrates. Therefore, the decrease in the connection reliability of the bump due to failure in the polymer injection and the decrease in the reliability of the semiconductor device can be suppressed.

Further, in the semiconductor device of the present embodiment, it is unnecessary to inject the polymer from the end portions after the step of bonding the silicon substrates, and therefore, restriction of a viscosity of a polymer precursor is loosed, so that a heat-resistant polymer material with a relatively high viscosity can be used as a polymer material for the bump protection. A high-viscosity polymer tends to have high heat resistance, and therefore, even if the package substrate (third substrate) is bonded to the layered semiconductor formed by bonding the first silicon substrate (first substrate) and the second silicon substrate (second substrate) at a high temperature (for example, 250° C. or higher) required for the copper bump bonding, the polymer film for the bump protection formed between the first substrate and the second substrate is not altered. Accordingly, the decrease in the connection reliability of the bump can be suppressed.

Still further, in the semiconductor device of the present embodiment, the heights of the bump electrode (first electrode), the dummy bump (first dummy bump), and the heat-resistant polymer film (first insulating film) formed on the first substrate are uniformed to each other. Also, the heights of the bump electrode (second electrode), the dummy bump (second dummy bump), and the heat-resistant polymer film (second insulating film) formed on the second silicon substrate (second substrate) are uniformed to each other. Therefore, when the first substrate and the second substrate are bonded to each other so as to electrically connect between the first electrode and the second electrode, the first dummy bump and the second insulating film are bonded to each other and the second dummy bump and the first insulating film are bonded to each other simultaneously, so that the load applied to the first electrode and the second electrode is not varied, and therefore, the decrease in the connection reliability of the bump can be suppressed.

Still further, in the semiconductor device of the present embodiment, the first dummy bump and the second dummy bump are provided, so that the heights of the first electrode and the first insulating film can be kept constant, and the heights of the second electrode and the second insulating film can be kept constant. Therefore, when the first substrate and the second substrate are bonded to each other, no space occurs between the bonding surfaces due to the variation in height between the first insulating film and the second insulating film, and therefore, the decrease in the connection reliability of the bump electrode can be suppressed. Also, the first dummy bump is bonded to the second insulating film, and the second dummy bump is bonded to the first insulating film, and therefore, the increase in the load required for the bonding the first substrate and the second substrate to each other can be suppressed even if the number of dummy bumps increases. Therefore, the decrease in the connection reliability of the bump due to the decrease in the connection load per bump can be suppressed, so that the electrical connection between the first electrode and the second electrode can increase the connection reliability.

In the first embodiment, as illustrated in FIG. 6, it is set that all of the shortest distance (S1) between the bump electrodes 500, the shortest distance (S2) between the bump electrode 500 and the dummy bump 510, and the shortest distance (S3) between the dummy bumps 510 on the same silicon substrate are equalized to each other. However, it is not required to equalize all of these distances to each other. In the semiconductor device of the comparison example 1, it has been found that the uneven white contrast corresponding to the voids (spaces, airspaces) observed by the infrared microscope photograph for the region where no bump electrode is arranged is caused from a portion which is five times the S1 away from an end portion of the bump electrode. That is, in the layered semiconductor as described in the comparison example 1, which is such a semiconductor device as having the region where there is no dummy bump or bump electrode on the upper surface of the heat-resistant polymer film within five times the distance of S1 from an arbitrary point thereon, there is a risk that the surface of the heat-resistant polymer film is concave, and the voids (spaces) are caused between the silicon substrates upon the sticking of the silicon substrates.

In other words, when the shortest distance between the first electrodes (the bump electrodes 500 formed on the first silicon substrate) is represented as S1, the shortest distance between the first electrode and the first dummy bump (the dummy bump 510 formed on the first silicon substrate) is represented as S2, and the shortest distance between the first dummy bumps is represented as S3, if the lengths of the S2 and the S3 are five times the S1 or longer, there is such a possibility that the voids are caused between the silicon substrates, which results in the decrease in the connection reliability between the stuck silicon substrates.

Therefore, in order to suppress the voids, it is preferred that the lengths of the S2 and the S3 are shorter than five times the S1. Further, if there is no layout restriction, it is more desired that the S2 and the S3 are substantially equal to the S1 in a point of view of the planarity of the surface polished by the CMP method. Still further, the dummy bumps 510 and 511 can be appropriately thinned out within a range without adverse effect on the connection reliability of the bump electrodes 500.

On the other hand, if the shortest distance (S4) between the dummy bump 510 and the dummy bump 511 formed on the respective different silicon substrates of the first silicon substrate 100 and the second silicon substrate 101 is too short, there is a risk that the dummy bump 510 and the dummy bump 511 are bonded to each other due to misalignment upon the sticking of the silicon substrates, and the load to be applied to the bump electrode upon the bonding is partially lost, and therefore, certainty of the bonding between the bump electrodes is reduced. Therefore, it is required that the length of the S4 is larger than the misalignment (alignment accuracy) of a machine for bonding silicon substrates. Since there is high possibility of the misalignment caused in a range shorter than 1 μm, the shortest distance (S4) between the dummy bump 510 and the dummy bump 511 is set to 1 μm or longer in the present embodiment.

Further, in the semiconductor device of the present embodiment illustrated in FIG. 6, the dummy bump 511 formed on the second silicon substrate 101 (not illustrated) is arranged at the closest positions to top-, bottom-, right-, and left-side of the dummy bump 510 formed on the first silicon substrate 100 (not illustrated). However, the layout of the dummy bump is not limited to this. For example, as a modification example of the semiconductor device of the present embodiment illustrated in FIG. 9, the dummy bump 510 formed on the first silicon substrate 100 can be also arranged at the closest positions to the dummy bump 510 formed on the same first silicon substrate 100 (not illustrated) in a first direction (horizontal direction in the drawing) and in a second direction (vertical direction in the drawing).

That is, a layout can be considered, in which the dummy bump 511 is not arranged between adjacent dummy bumps 510 in the first direction or the second direction, that is, for example, in which the dummy bump 511 is arranged at a position shifted from an intermediate point between the adjacent dummy bumps 510 in the first direction toward the second direction by half of the length of S3. In other words, even in a layout such that an arbitrary dummy bump 510 is adjacent to another dummy bump 510 in the first direction, and the dummy bump 511 is arranged between the arbitrary dummy bump 510 and still another dummy bump 510 that is adjacent to the another dummy bump in the second direction, the above-described uneven white contrast (voids, airspaces, empty spaces) is prevented to improve the bonding reliability between the silicon substrates.

Further, as long as compliance with the layout restriction for the bump arrangement that the lengths of the S2 and the S3 are less than five times the S1 as described above, several types of layouts can be mixed. For example, the dummy bumps are arranged by using an automatic layout tool so as to equalize a density of the arrangement of the bump electrodes inside the chip to some extent, so that the planarity of CMP can be improved.

Still further, in the present embodiment, it is set that each planar layout shape of the dummy bumps 510 and 511 is square. However, even in other shapes, the same effect can be expected. Each shape in a planar view of the dummy bumps 510 and 511 may be, for example, quadrangle such as rectangle illustrated in FIG. 10A, hexagon illustrated in FIG. 10B, octagon illustrated in FIG. 10C, hexadecagon illustrated in FIG. 10D, or circle illustrated in FIG. 10E. Also, as each shape in the planar view of the dummy bumps 510 and 511, a cross shape that is a combination of two rectangles illustrated in FIG. 10F, an L shape illustrated in FIG. 10G, or a T shape illustrated in FIG. 10H may also be adopted. However, in points of view of the buried shape of the copper plating and the planarity upon the CMP, if the shape is polygon or circle, it is desired that a circumscribed circle diameter of the shape is substantially equal to a circumscribed circle diameter of the bump electrode. If the shape is the combination of two rectangles, it is desired that a short-side length of each rectangle is substantially equal to the circumscribed circle diameter of the bump electrode.

FIGS. 10A to 10H are planar layouts each illustrating the modification example of the dummy bumps 510 and 511 used in the semiconductor device of the present embodiment. FIGS. 10A to 10H illustrate planar layouts in the cases of quadrangle, hexagon, octagon, hexadecagon, circle, cross shape, L shape, and T shape as each shape of the dummy bumps 510 and 511 in the planar view, respectively.

Figure 10A:
FIG. 10 is a planar layout illustrating a modification example of the semiconductor device according to the first embodiment of the present invention.
Figure 10B:
Figure 10C:
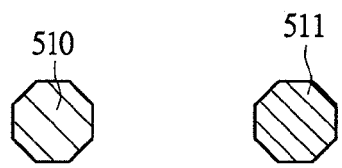
Figure 10D:
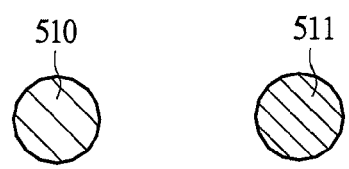
Figure 10E:
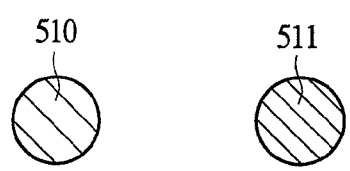
Figure 10F:
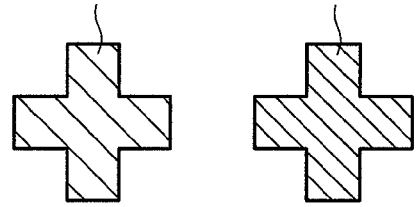
Figure 10G:
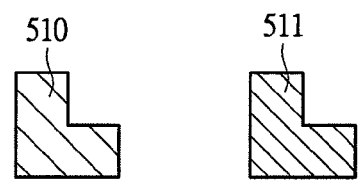
Figure 10H:
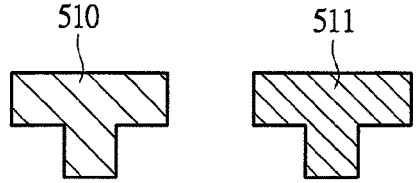

Note that it is preferred that each of the dummy bumps 510 and 511 has a no angular pattern such as circle rather than a pattern with an acute-angled portion such as triangle in order not to apply stress to the heat-resistant polymer film 300 or others in the peripheries of the dummy bumps 510 and 511. Therefore, the stress generated on the silicon substrates can be smaller in the case of adopting the regular octagon as illustrated in FIG. 10C than the case of adopting the quadrangle (rectangle) as illustrated in FIG. 10A as each pattern of the dummy bumps 510 and 511 in the planar view.

Still further, in the present embodiment, polybenzoxazole is used as the heat-resistant polymer film 300. However, other heat-resistant polymers can be used. A polymer such as polyimide and benzocyclobutene can also be used. Still further, if the polymer has photosensitivity, a step such as etching can be eliminated, and therefore, the number of steps can be reduced.

Still further, in the present embodiment, so-called rear-surface via last process is adopted, in which the first silicon substrate 100 and the second silicon substrate 101 are stuck to each other, and then, the through electrode 270 is formed in the first silicon substrate 100 from the rear surface thereof. However, the present invention can be effective even by other methods such as a method of forming the through electrode as a part of the previous step.

Still further, in the present embodiment, the example of forming the semiconductor element on both of the first silicon substrate 100 and the second silicon substrate 101 is explained. However, effectiveness of the present invention is not limited to this example, and the present invention is applicable to such a case as bonding a silicon substrate on which the semiconductor element is formed and a substrate (wiring substrate) on which the semiconductor element is not formed to each other.

(Second Embodiment)

In a present embodiment, an example of a semiconductor device obtained by bonding a front surface of a silicon substrate on which a semiconductor element is formed and a rear surface on which the semiconductor element is not formed to each other will be explained with reference to FIGS. 11 to 14. Note that the explanation of a configuration with the same reference symbols and portions having the same functions as those of the configuration described above in the first embodiment will be omitted. FIGS. 11 to 14 are cross-sectional views of principal parts each explaining a manufacturing process of a layered semiconductor of the present embodiment.

Figure 11:
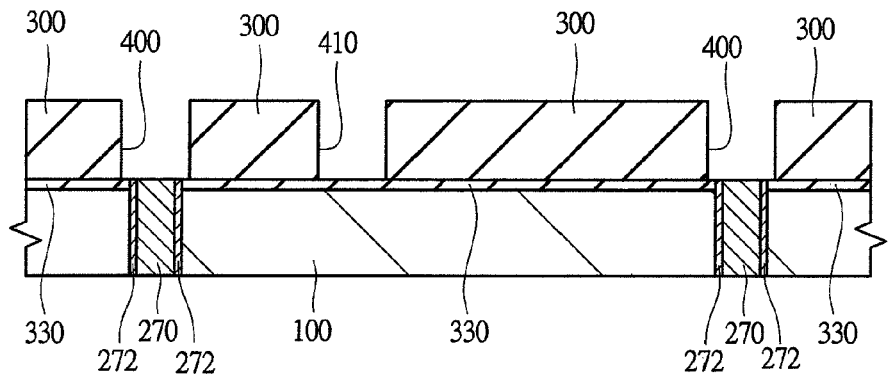
FIG. 11 is a cross-sectional view of a principal part explaining a manufacturing step for a layered semiconductor according to a second embodiment of the present invention.

First, as illustrated in FIG. 11, a rear-surface insulating film 330 formed of, for example, a silicon oxide film is formed on a rear surface of a first silicon substrate 100 on which a semiconductor element is not formed, and then, a through electrode 270 for electrical connection to a main surface of the first silicon substrate 100 on which the semiconductor element is formed is formed by the same method as the method described above in the first embodiment with reference to FIG. 8. The through electrode 270 is an electrode penetrating through the rear-surface insulating film 330 and reaching a wiring (not illustrated) formed, via a contact plug, on the semiconductor element on the main surface of the first silicon substrate 100. Note that the semiconductor element, the interlayer insulating film, and others are omitted in the drawing. Note that, as different from the first silicon substrate 100 described in the first embodiment, FIG. 11 illustrates the first silicon substrate 100 turned upside down. That is, a lower surface of the first silicon substrate 100 illustrated in FIGS. 11 to 14 is the main surface of the first silicon substrate 100, and an upper surface thereof on which the rear-surface insulating film 330 is formed is a rear surface of the first silicon substrate 100. In description of a subsequent step, the rear surface side of the first silicon substrate 100 is described as the upper side. That is, a heat-resistant polymer film 300 described later is formed on, for example, the first silicon substrate 100.

Subsequently, the heat-resistant polymer film 300 made of polybenzoxazole is formed on the rear surface of the first silicon substrate 100 so as to interpose the rear-surface insulating film 330 therebetween, and then, the heat-resistant polymer film 300 is processed by using photolithography and etching techniques, so that a bump opening portion 400 which exposes an upper surface of the through electrode 270 is formed, and a dummy bump opening portion 410 which partially exposes an upper surface of the rear-surface insulating film 330 is formed in the same step. Note that, if the first silicon substrate 100 is thinned, the first silicon substrate 100 is fixed to a supporting substrate for subsequent transferring in some cases. However, the supporting substrate or others is omitted in the drawing.

Figure 12:
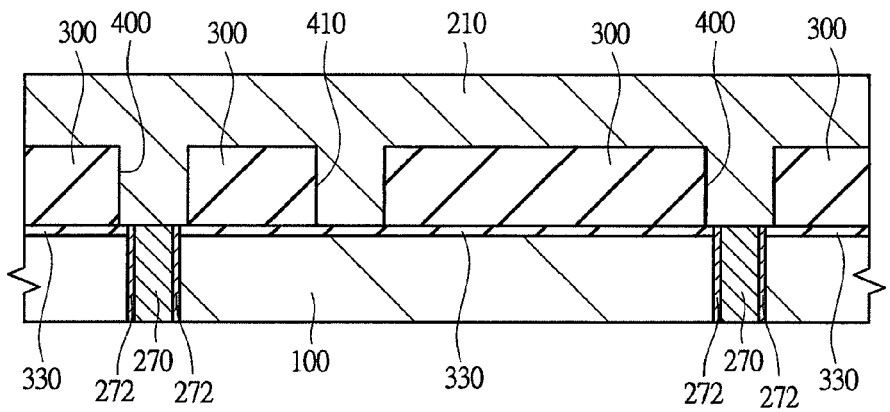
FIG. 12 is a cross-sectional view of a principal part explaining the method of manufacturing the layered semiconductor, continued from FIG. 11.

Next, as illustrated in FIG. 12, a metal film 210 formed of a TiN film having a film thickness of about 70 nm and a copper film having a film thickness of about 500 nm is sequentially deposited from the rear surface side of the first silicon substrate 100 by a sputtering method on the heat-resistant polymer film 300, the rear-surface insulating film 330, and the through electrode 270 so as to cover each of inner walls and bottom portions of the bump opening portion 400 and the dummy bump opening portion 410.

Figure 13:
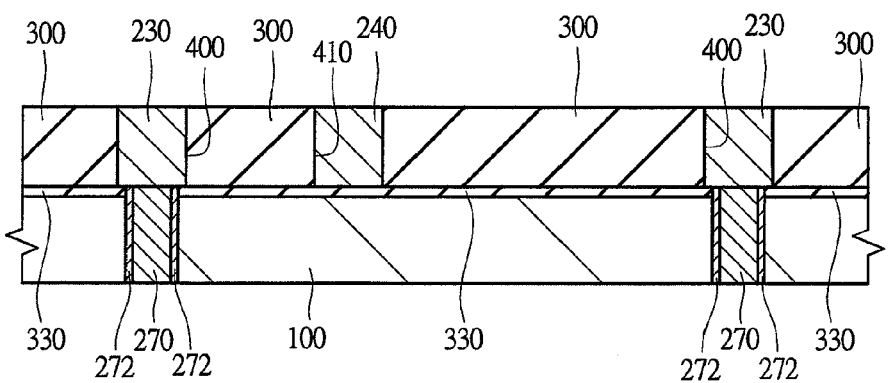
FIG. 13 is a cross-sectional view of a principal part explaining the method of manufacturing the layered semiconductor, continued from FIG. 12.

Next, as illustrated in FIG. 13, the metal film 210 is polished by the CMP method to expose the upper surface of the heat-resistant polymer film 300, so that a bump electrode 230 formed of the metal film 210 inside the bump opening portion 400 and a dummy bump 240 formed of the metal film 210 inside the dummy bump opening portion 410 are formed. At this time, the CMP is performed so as not to form a height difference among the upper surface of the heat-resistant polymer film 300, the upper surface of the bump electrode 230, and the upper surface of the dummy bump 240. Here, by arranging a plurality of dummy bumps 240 at predetermined intervals as described in the first embodiment, it is prevented that the upper surface of the heat-resistant polymer film 300 is lower than each upper surface of the bump electrode 230 and the dummy bump 240 due to the excessive polishing of the upper surface of the heat-resistant polymer film 300.

Figure 14:
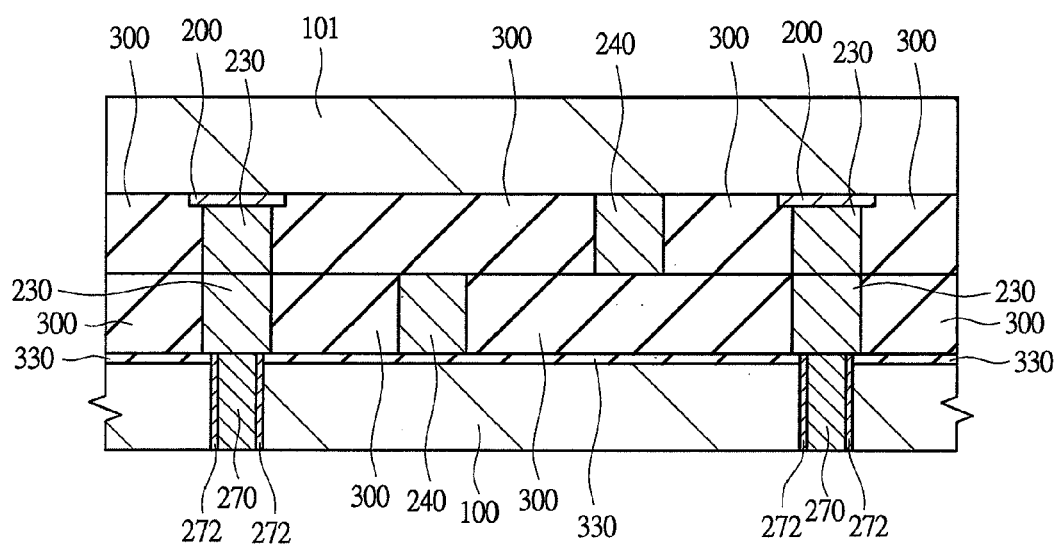
FIG. 14 is a cross-sectional view of a principal part explaining the method of manufacturing the layered semiconductor, continued from FIG. 13.

Next, as illustrated in FIG. 14, a second silicon substrate 101 on which an integrated circuit is formed in a predetermined region is prepared, and the second silicon substrate 101 is subjected to the same processes as the steps described with reference to FIGS. 1 to 5 in the first embodiment. That is, a bump opening portion 400 and a dummy bump opening portion 410 are formed in a heat-resistant polymer film 300 on the second silicon substrate 101, and then, a bump electrode 230 is formed in the bump opening portion 400, and a dummy bump 240 is also formed in the dummy bump opening portion 410. On the second silicon substrate 101, while a bottom portion of the bump electrode 230 is electrically connected to the semiconductor element or others on the main surface of the second silicon substrate 101 via a metal wiring 200, the dummy bump 240 is not connected to the metal wiring 200 and is also electrically insulated from the semiconductor device.

Subsequently, the rear surface of the first silicon substrate 100 and the main surface of the second silicon substrate 101 are stuck so as to be opposite to each other, and are heated and pressure-bonded, so that the respective bump electrodes 230 formed on the first silicon substrate 100 and the second silicon substrate 101 are electrically connected to each other simultaneously with the bonding between the heat-resistant polymer films 300 formed on the respective silicon substrates. At this time, the dummy bump 240 formed on the first silicon substrate 100 is bonded to the upper surface of the heat-resistant polymer film 300 formed on the second silicon substrate 101, and the dummy bump 240 formed on the second silicon substrate 101 is bonded to the upper surface of the heat-resistant polymer film 300 formed on the first silicon substrate 100. Here, each planar layout of the bump electrodes 230 and the dummy bumps 240 after the sticking of the two silicon substrates is the same as the planar layout illustrated in FIG. 6.

And then, a solder bump is formed on the silicon substrate in which the through electrode 270 is formed, and then, the layered semiconductor device is singulated into chips by a dicing machine, and is mounted on a package substrate 120 similarly to FIG. 8, so that the semiconductor device of the present embodiment is completed. At this time, the through electrode 270 formed on the first silicon substrate 100 is electrically connected to an outside of the semiconductor device via the solder bump 260 and the metal wiring 201 formed on the package substrate 120 similarly to FIG. 8. However, since the through electrode 270 is connected to a wiring of the semiconductor element in the first silicon substrate 100, the through electrode 270 and the solder bump 260 are not directly in contact with each other. That is, the through electrode 270 does not reach an upper surface on an opposite side to the rear surface of the first silicon substrate 100. Here, an electrode which is electrically connected to the through electrode 270 and is exposed to the upper surface of the silicon substrate 100 is directly in contact with the solder bump 260, so that the through electrode 270 and the solder bump 260 are electrically connected to each other via the electrode.

For the semiconductor device manufactured as described above, the present inventors have evaluated the voids caused in the heat-resistant polymer film and have analyzed the bump bonding state, and they have found that the connection reliability of the bump equal to that of the first embodiment has been obtained.

This shows that the same effect as that of the first embodiment can be obtained even if the main surface and the rear surface of the silicon substrates are bonded to each other in the present embodiment as different from the first embodiment. If only the main surfaces of the silicon substrates are bonded so as to be opposite to each other as described in the first embodiment, the number of layers formed of silicon substrates is limited to two. However, if the main surface of a silicon substrate and the rear surface of a different silicon substrate are bonded to each other based on the present embodiment, three or more layers of substrates can be achieved.

Further, in the present embodiment, the main surface of the silicon substrate and the rear surface of the different silicon substrate are bonded to each other. However, by combining the method of bonding the main surfaces of the silicon substrates described in the first embodiment and the method of manufacturing the semiconductor device of the present embodiment, a highly-versatile layered structure can be achieved. Such an example is illustrated in FIGS. 15 to 17.

Figure 15:
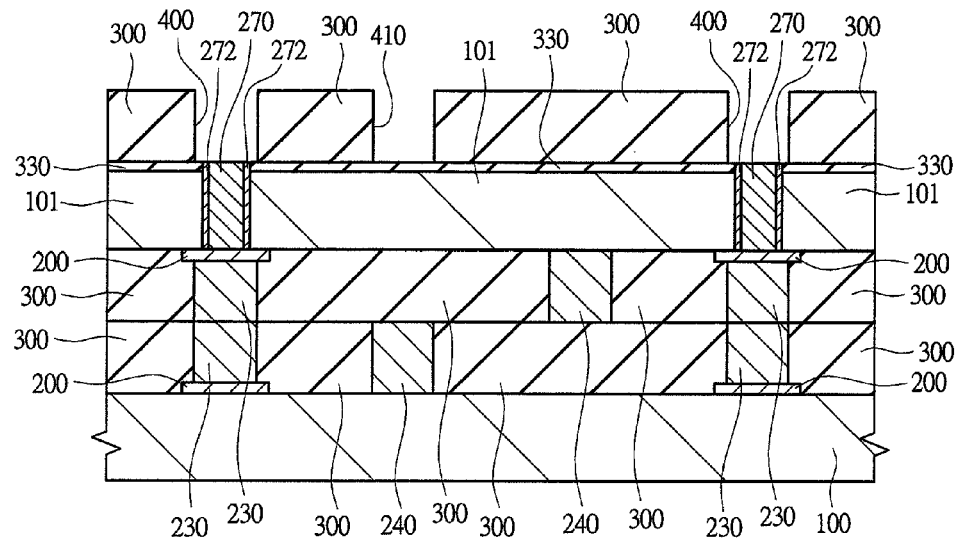
FIG. 15 is a cross-sectional view of a principal part explaining a manufacturing step for a modification example of a layered semiconductor according to the second embodiment of the present invention.
Figure 16:
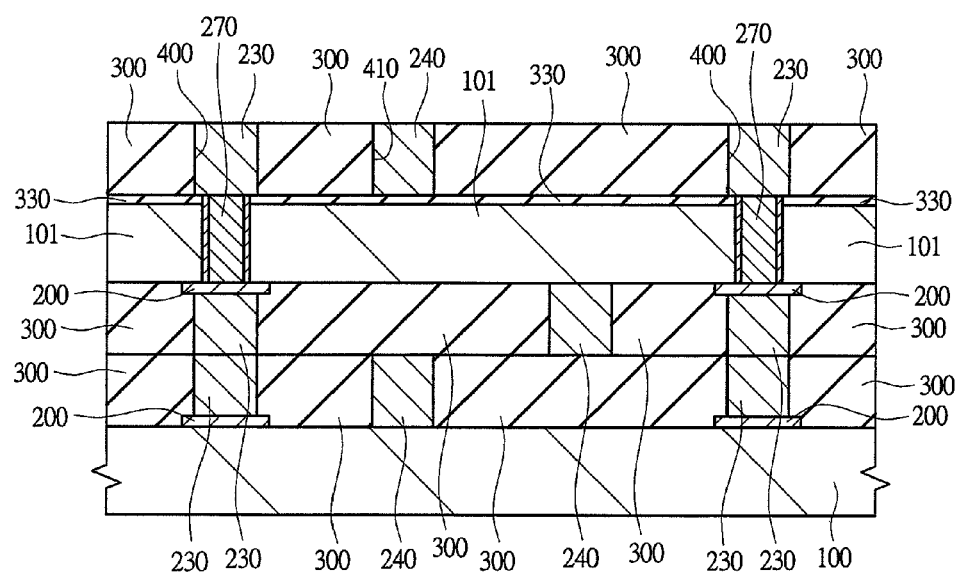
FIG. 16 is a cross-sectional view of a principal part explaining the method of manufacturing the layered semiconductor, continued from FIG. 15.
Figure 17:
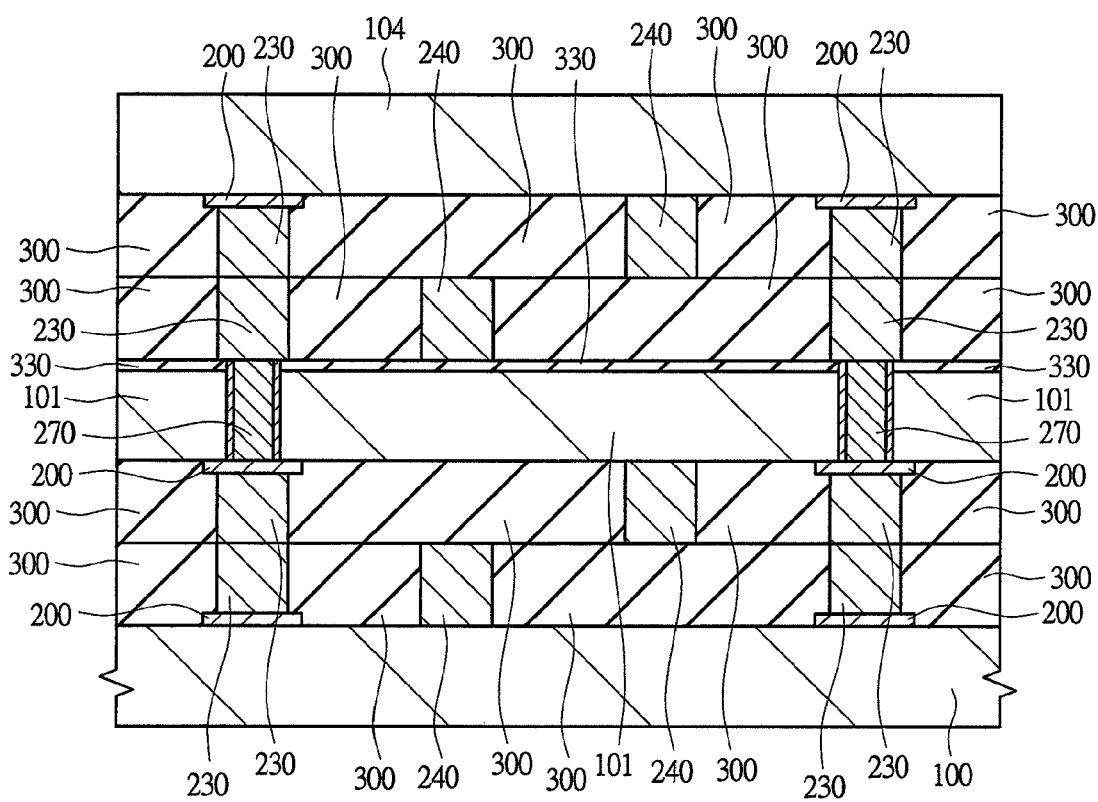
FIG. 17 is a cross-sectional view of a principal part explaining the method of manufacturing the layered semiconductor, continued from FIG. 16.

FIGS. 15 to 17 are cross-sectional views of principal parts illustrating a method of manufacturing a layered semiconductor which is a modification example of the second embodiment.

First, as illustrated in FIG. 15, based on the method of manufacturing the semiconductor device of the first embodiment, the respective main surfaces of the first silicon substrate 100 and the second silicon substrate 101 are bonded so as to be opposite to each other, and the through electrode 270 is formed in the rear surface of the second silicon substrate 101. Subsequently, by the same step as the step described with reference to FIG. 11, the heat-resistant polymer film 300 having the bump opening portion 400 and the dummy bump opening portion 410 is formed on the rear surface of the second silicon substrate 101.

Next, as illustrated in FIG. 16, based on the steps described with reference to FIGS. 12 and 13, the bump electrode 230 and the dummy bump 240 are formed in the bump opening portion 400 and the dummy bump opening portion 410, respectively.

Next, as illustrated in FIG. 17, the rear surface of the second silicon substrate 101 is bonded to a main surface of a third silicon substrate 104 which is formed substantially similarly to the second silicon substrate 101 and which includes a semiconductor element, a heat-resistant polymer film 300, a bump electrode 230, and a dummy bump 240, so that a semiconductor device formed of three-layered silicon substrates can be formed.

Note that, in the modification example of the semiconductor device of the present embodiment described with reference to FIGS. 15 to 17, the layout and the shape of the bump electrode and the dummy bump, the heat-resistant polymer film, the material, and others are the same as those of the first embodiment. However, the configuration of the present embodiment is not limited to this configuration, and the application example described with reference to FIG. 9, FIGS. 10A to 10H, or others in the first embodiment is similarly applicable to the present embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effectively applied to a technique of manufacturing a semiconductor device in which silicon substrates are electrically connected to each other via a bump.

What is claimed is:

1. A semiconductor device comprising: a first substrate on whose one surface a first electrode and a first insulating film are formed; and a second substrate on whose one surface a second electrode and a second insulating film are formed, and the first substrate and the second substrate being layered and being electrically connected to each other by bonding the one surface of the first substrate and the one surface of the second substrate, wherein the first electrode is formed in a first region of the first insulating film, a first dummy bump made of the same material as a material of the first electrode is formed in a second region of the first insulating film, the second electrode is formed in a first region of the second insulating film, and a second dummy bump made of the same material as a material of the second electrode is formed in a second region of the second insulating film, in a direction vertical to the one surface of the first substrate, a distance from the one surface of the first substrate to an upper surface of the first electrode, a distance from the one surface of the first substrate to an upper surface of the first dummy bump, and a distance from the one surface of the first substrate to an upper surface of the first insulating film are equal to each other, in a direction vertical to the one surface of the second substrate, a distance from the one surface of the second substrate to an upper surface of the second electrode, a distance from the one surface of the second substrate to an upper surface of the second dummy bump, and a distance from the one surface of the second substrate to an upper surface of the second insulating film are equal to each other, the first dummy bump is in contact with the second insulating film, and the second dummy bump is in contact with the first insulating film, and the first insulating film and the second insulating film contain at least one of polyimide, polybenzoxazole, and benzocyclobutene.

2. The semiconductor device according to claim 1, wherein each of the first substrate and the second substrate is a semiconductor wafer or a semiconductor chip.

3. The semiconductor device according to claim 1, wherein each of the first insulating film and the second insulating film contains heat-resistant polymer.

4. The semiconductor device according to claim 1, wherein each of the first insulating film and the second insulating film contains photosensitive polymer.

5. The semiconductor device according to claim 1, wherein each of the first electrode, the first dummy bump, the second electrode, and the second dummy bump contains copper.

6. The semiconductor device according to claim 1, wherein a planar layout shape of each of the first dummy bump and the second dummy bump is quadrangle, hexagon, octagonal, hexadecagon, circle, cross shape, L shape, or T shape.

7. The semiconductor device according to claim 1, wherein both of the shortest distance between the first electrode and the first dummy bump and the shortest distance between the first dummy bumps are less than 5 times the shortest distance between the first electrodes.

* * * * *